United States Patent
Toyoda

(10) Patent No.: US 7,547,958 B2
(45) Date of Patent: Jun. 16, 2009

(54) SEMICONDUCTOR DEVICE, ELECTRONIC DEVICE, AND MANUFACTURING METHOD OF THE SAME

(75) Inventor: Hisashi Toyoda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/703,256

(22) Filed: Feb. 7, 2007

(65) Prior Publication Data

US 2007/0181976 A1 Aug. 9, 2007

(30) Foreign Application Priority Data

Feb. 9, 2006 (JP) ............................. 2006-032758
Oct. 13, 2006 (JP) ............................. 2006-280649

(51) Int. Cl.
H01L 29/73 (2006.01)
(52) U.S. Cl. ...................... 257/565; 257/588; 257/621; 257/E29.174; 257/E29.183
(58) Field of Classification Search ................ 257/565, 257/47, 197; 438/189
See application file for complete search history.

(56) References Cited

U.S. PATENT DOCUMENTS

| | | | | |
|---|---|---|---|---|
| 5,315,151 | A | 5/1994 | Hsieh et al. ................ | 257/592 |
| 6,440,810 | B1 | 8/2002 | Johansson et al. .......... | 438/309 |
| 6,455,919 | B1 | 9/2002 | Brennan et al. ............ | 257/616 |
| 6,780,725 | B2 | 8/2004 | Fujimaki .................... | 438/313 |
| 6,802,708 | B2 | 10/2004 | Kanzaki et al. ............. | 432/91 |
| 6,838,349 | B2 | 1/2005 | Yamauchi ................... | 438/350 |
| 6,846,710 | B2 | 1/2005 | Yi et al. ..................... | 438/202 |
| 7,091,099 | B2 | 8/2006 | Ohnishi et al. ............. | 438/320 |
| 2003/0219952 | A1* | 11/2003 | Fujimaki .................... | 438/322 |
| 2004/0104448 | A1 | 6/2004 | Marty et al. ................ | 257/517 |

FOREIGN PATENT DOCUMENTS

| | | |
|---|---|---|
| JP | 5-129319 | 5/1993 |
| JP | 8-181153 | 7/1996 |
| JP | 11-189753 | 7/1999 |
| JP | 2002-26027 | 1/2002 |
| JP | 2002-313799 | 10/2002 |
| JP | 2003-45884 | 2/2003 |
| JP | 2003-338558 | 11/2003 |
| JP | 2004-11975 | 1/2004 |

(Continued)

Primary Examiner—Lynne A. Gurley
Assistant Examiner—Cathy N Lam
(74) Attorney, Agent, or Firm—Miles & Stockbridge P.C.

(57) ABSTRACT

The present invention provides a technology that makes it possible to enhance the gain and the efficiency of an RF bipolar transistor. Device isolation is given between a p+ type isolation region and an n+ type collector embedded region and between a p+ type isolation region and an n type collector region (an n+ type collector extraction region) with an isolation section that surrounds the collector extraction region in a plan view and is formed by embedding a dielectric film in a groove penetrating an isolation section, a collector region, and a collector embedded region and reaching a substrate. Further, a current route is formed between an emitter wiring (a wiring) and the substrate with an electrically conductive layer formed by embedding the electrically conductive layer in a groove penetrating a dielectric film, silicon oxide films, a semiconductor region, and the isolation regions and reaching the substrate, and thereby the impedance between the emitter wiring and the substrate is reduced.

10 Claims, 36 Drawing Sheets

FOREIGN PATENT DOCUMENTS

| | | |
|---|---|---|
| JP | 2004-40131 | 2/2004 |
| JP | 2004-241779 | 8/2004 |
| JP | 2004-274023 | 9/2004 |
| JP | 2004-311971 | 11/2004 |
| JP | 2005-44956 | 2/2005 |
| JP | 2005-044956 * | 2/2005 |
| WO | WO 01/39264 | 5/2001 |

* cited by examiner

SEMICONDUCTOR DEVICE, ELECTRONIC DEVICE, AND MANUFACTURING METHOD OF THE SAME

CROSS-REFERENCE TO RELATED APPLICATION

The present application claims priority from Japanese patent applications No. 2006-280649 filed on Oct. 13, 2006 and No. 2006-32758 filed on Feb. 9, 2006, the contents of which are hereby incorporated by reference into this application.

BACKGROUND OF THE INVENTION

The present invention relates to a semiconductor device, an electronic device, and a manufacturing technology of the semiconductor device, in particular a technology effectively applicable to an RF (Radio Frequency) bipolar transistor for a PA (Power Amplifier).

Structures wherein device isolation is given between a substrate and a collector with a groove in which a dielectric film is embedded in the case of a silicon germanium (SiGe) HBT (Heterojunction Bipolar Transistor) are disclosed in Japanese Unexamined Patent Publications Nos. 2005-44956, 2004-241779, 2004-111975, 2004-40131, 338558/2003, 313799/2002, and Hei 5 (1993) 129319, Japanese Unexamined International Patent Application No. 2003-515927, and Japanese Unexamined Patent Publications Nos. 2004-311971, 2004-274023, Hei 11 (1999)-189753, 2003-45884, and 2002-26027.

Further, a structure of a high-power bipolar transistor wherein emitter wiring comprises in-chip conductive type wiring is disclosed in Japanese Unexamined Patent Publication No. Hei 8 (1996)-181153.

SUMMARY OF THE INVENTION

The present inventors have worked on an RF (Radio Frequency) bipolar transistor for a PA (Power Amplifier) used for a wireless LAN. The important three items in the development of an RF bipolar transistor are higher efficiency, higher output, and higher gain, and the improvement of those is desired. Even though a characteristic of an active element is merely changed in order to improve each of those three items individually, the item is in the relation of tradeoff with another item and hence the drawback of deteriorating the other item arises.

The present inventors, in order to improve the above three items individually, have studied a technology of realizing higher gain and higher efficiency by reducing the capacitance between a semiconductor substrate (hereunder referred to simply as "substrate") and a collector and reducing emitter impedance. During the course of the study, the present inventors have found the following challenges.

FIGS. 28 to 30 are a plan view of the substantial part of an RF bipolar transistor studied by the present inventors, a sectional view of the substantial part taken on line A-A in FIG. 28, and a circuit diagram of the RF bipolar transistor, respectively. The RF bipolar transistor studied by the present inventors has the structure wherein a base, a collector, and an emitter are disposed over the main surface of a substrate and the back surface on the opposite side of the substrate main surface is electrically connected to the emitter so as to have an identical potential. The device isolation between the substrate and the collector is secured by forming a PN junction (hereunder referred to as "PN junction isolation type") between: a p+ type substrate 101 and an n+ type collector embedded region 102; a p+ type isolation region 103 and the n+ type collector embedded region 102; and a p+ type isolation region 105 and a collector region 104 (a collector extraction region 107). Here, base wiring 108 electrically connected to the base, collector wiring 109 electrically connected to the collector, and emitter wiring 110 and 111 electrically connected to the emitter are disposed over the substrate 101 and the emitter wiring 111 is electrically connected to the substrate 101 via plugs 112, p+ type semiconductor regions 113, and the isolation regions 105 and 103. In the case where the device isolation between a substrate and a collector is a PN junction isolation type as stated above, a junction capacitance Cjs is formed between the substrate and the collector at the PN junction PNJ (shown with thick lines in FIGS. 28 and 29). Here, when the dielectric constant of vacuum is represented by $\in O$, the relative dielectric constant of Si (silicon) by K, the width of a depletion layer by W, and the area of a PN junction PNJ by Acx, the junction capacitance Cjs between the substrate and the collector can be expressed with the expression $Cjs=(\in O \cdot K/W) \cdot Acx$. In the case of such a structure as shown in FIGS. 28 and 29, not only the bottom surface of the collector embedded region 102 but also the side surfaces of the collector embedded region 102 and the collector region 104 (the collector extraction region 107) form the area Acx of the PN junction PNJ and hence that causes the junction capacitance Cjs between the substrate and the collector to increase.

Meanwhile, a capacitance Cce between a collector and an emitter is expressed with the expression $Cce=Cjs+Ccx$ when the wiring capacitance between the collector and the emitter is represented by Ccx. That is, a challenge here is that, as a junction capacitance Cjs between a substrate and a collector increases, the capacitance Cce between the collector and an emitter increases and thus the efficiency of an RF bipolar transistor is hardly improved.

Further, in a chip of an RF bipolar transistor, an anti-insulative structure is formed wherein the current pathway between emitter wiring 111 and a substrate 101 goes through p+ type semiconductor regions 113 and isolation regions 105 and 103 and hence the structure is configured so that the current pathway between the emitter wiring 111 and the substrate 101 may be additionally formed with a bonding wire outside the chip (not shown in the figures). Consequently, the impedance Ze between the emitter wiring 111 and the substrate 101 (the resistance component and the inductance component in the current pathway between the emitter wiring 111 and the substrate 101) increases. Here, when the cutoff frequency of an RF bipolar transistor is represented by fT, the operating frequency of the RF bipolar transistor by f, a base resistance by rb, and the capacitance between a base and a collector by Cbc, the power gain PG of the RF bipolar transistor is expressed with the expression $PG \cong 10 \log [fT/(8 \cdot \pi \cdot f2 \cdot rb \cdot Cbc \cdot Ze)]$. That is, a challenge here is that, when the impedance Ze increases, the power gain PG undesirably lowers and the gain of the RE bipolar transistor is hardly increased. In the application to a wireless LAN in particular, the operating frequency f is in a high-frequency band as high as 5 GHz and hence the influence of the impedance Ze on the power gain PG increases.

An object of the present invention is to provide a technology capable of realizing the higher gain and the higher efficiency of an RF bipolar transistor.

The above and other objects and the novel features of the present invention will be clearly understood through the descriptions and the attached drawings in the present specification.

The outline of typical embodiments of the invention disclosed in the present application is briefly explained as follows.

(1) A semiconductor device according to the present invention has a bipolar transistor in a first region over a semiconductor substrate and an emitter pad electrically connected to an emitter of the bipolar transistor in a second region over the semiconductor substrate and is provided with:

a first semiconductor layer formed over the semiconductor substrate and used for a collector of the bipolar transistor;

a second semiconductor layer formed over the first semiconductor layer and used for the collector;

a third semiconductor layer formed over the second semiconductor layer and used for a base of the bipolar transistor;

a fourth semiconductor layer formed in the third semiconductor layer and used for the emitter of the bipolar transistor;

a first electrode formed over the semiconductor substrate, electrically connected to the third semiconductor layer, and used for the base;

a second electrode formed over the semiconductor substrate, electrically connected to the fourth semiconductor layer, and used for the emitter;

a fifth semiconductor layer disposed so as to enclose the third and fourth semiconductor layers in a plan view and electrically connected to the first and second semiconductor layers;

a third electrode formed over the semiconductor substrate, electrically connected to the fifth semiconductor layer, and used for the collector;

a first groove being formed over the semiconductor substrate and reaching the semiconductor substrate; and a first electrically conductive film being embedded in the first groove and electrically connecting a first pad to the semiconductor substrate.

(2) Further, a semiconductor device according to the present invention is, in a semiconductor device according to the above item (1), provided with:

a second groove disposed so as to enclose the fifth semiconductor layer in a plan view over the semiconductor substrate and formed so as to penetrate the second and first semiconductor layers and reach the semiconductor substrate; and a first dielectric film embedded in the second groove.

(3) Yet further, an electronic device according to the present invention has a semiconductor chip over a main surface of a supporting substrate, the semiconductor chip having a bipolar transistor in a first region over a semiconductor substrate and an emitter pad electrically connected to an emitter of the bipolar transistor in a second region over the semiconductor substrate, wherein:

the semiconductor chip is mounted over the supporting substrate so as to touch a metal frame patterned over the main surface of the supporting substrate; and the semiconductor chip is provided with a first semiconductor layer formed over the semiconductor substrate and used for a collector of the bipolar transistor, a second semiconductor layer formed over the first semiconductor layer and used for the collector, a third semiconductor layer containing silicon germanium, being formed over the second semiconductor layer, and being used for a base of the bipolar transistor, a fourth semiconductor layer formed in the third semiconductor layer and used for the emitter of the bipolar transistor, a first electrode formed over the semiconductor substrate, electrically connected to the third semiconductor layer, and used for the base, a second electrode formed over the semiconductor substrate, electrically connected to the fourth semiconductor layer, and used for the emitter, a fifth semiconductor layer disposed so as to enclose the third and fourth semiconductor layers in a plan view and electrically connected to the first and second semiconductor layers, a third electrode formed over the semiconductor substrate, electrically connected to the fifth semiconductor layer, and used for the collector, a first groove being formed in the second region over the semiconductor substrate and reaching the semiconductor substrate, a first electrically conductive film being embedded in the first groove and electrically connecting a first pad to the semiconductor substrate, a second groove disposed so as to enclose the fifth semiconductor layer in a plan view in the first region over the semiconductor substrate and formed so as to penetrate the second and first semiconductor layers and reach the semiconductor substrate, and a first dielectric film embedded in the second groove.

(4) Yet further, a method for manufacturing a semiconductor device according to the present invention is a method for manufacturing a semiconductor device having a bipolar transistor in a first region over a semiconductor substrate and an emitter pad electrically connected to an emitter of the bipolar transistor in a second region over the semiconductor substrate, wherein:

the method includes the steps of (a) forming a first semiconductor layer used for a collector of the bipolar transistor over the semiconductor substrate, (b) forming a second semiconductor layer used for the collector over the first semiconductor layer, (c) forming a fifth semiconductor layer electrically connected to the first and second semiconductor layers in the first region over the semiconductor substrate, (d) forming a third semiconductor layer used for a base of the bipolar transistor over the second semiconductor layer, (e) forming a fourth semiconductor layer used for the emitter of the bipolar transistor in the third semiconductor layer, (f) forming a first groove reaching the semiconductor substrate in the second region over the semiconductor substrate, (g) embedding a first electrically conductive film in the first groove, and (h) forming the emitter pad electrically connected to the first electrically conductive film in the second region over the semiconductor substrate; and the fifth semiconductor layer is formed so as to enclose the third and fourth semiconductor layers in a plan view.

(5) Yet further, a method for manufacturing a semiconductor device according to the present invention, in a method for manufacturing a semiconductor device according to the above item (4), includes, after the step (c), the steps of:

(i) forming a second groove so as to enclose the fifth semiconductor layer in a plan view in the first region over the semiconductor substrate, penetrate the second and first semiconductor layers, and reach the semiconductor substrate; and (j) embedding a first dielectric film in the second groove.

(6) In addition, a semiconductor device according to the present invention is, in a semiconductor device according to the above item (1), provided with a plurality of the first grooves.

The present invention makes it possible to improve the characteristics of a bipolar transistor.

DETAILED DESCRIPTION OF THE PREFERRED EMBODIMENTS

Figure 1:
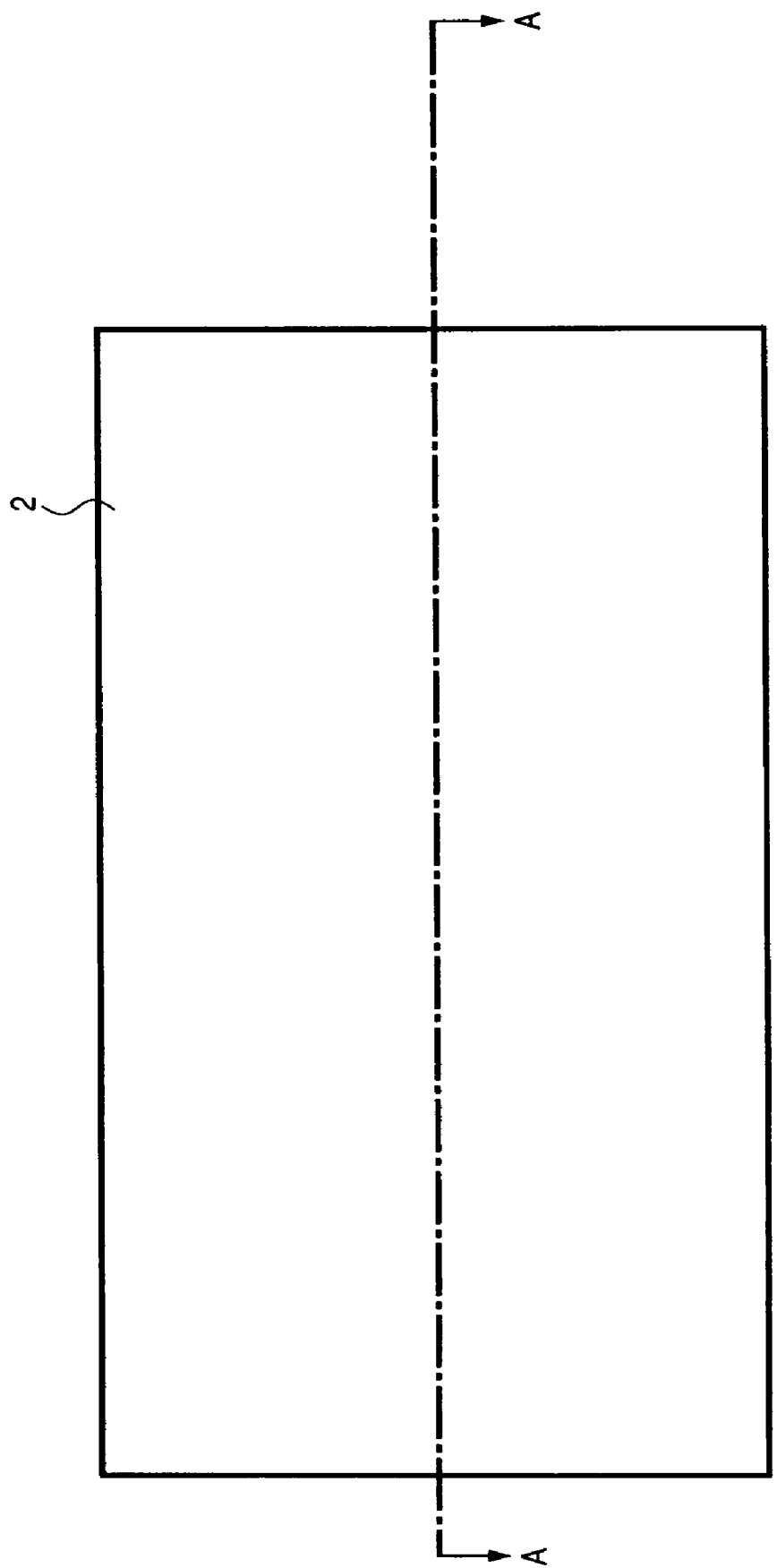
FIG. 1 is a plan view of a substantial part explaining the manufacturing method of a semiconductor device according to Embodiment 1 of the present invention.

In the following embodiments, explanations are made in the forms of divided plural sections or embodiments for convenience if necessary. Unless otherwise specified however, the explanations are not unrelated to each other and an explanation is related to a part or the all of another explanation as a modified example, a detailed explanation, a supplementary explanation, or the like.

Further, when the number of elements (including the number of pieces, numerical values, quantities, ranges, and others) is referred to in the following embodiments, except the case where the number of the elements is specified or limited to a specific number obviously in theory or other cases, the number of the elements is not limited to the specific number and may take a number above or below the specific number.

Yet further, in the following embodiments, it goes without saying that, a constituent element in an embodiment (including an element step and others) is not necessarily essential except the case where the constituent element is specified or considered as essential obviously in theory and other cases. In addition, with regard to a constituent element or the like in an example or the like, it goes without saying that, when "comprise A" or "include A" is referred to, it does not mean that an element other than A is excluded except the case of specifying that the element is exclusively referred to as A.

Likewise, in the following embodiments, when the shape, the positional relation, or the like of a constituent element or the like is referred to, it means that an expression or the like close or similar to the shape or the like is substantially included except the case where the shape or the like is specified or considered as not included obviously in theory or other cases. This criterion is also applied to such a numerical value and a range as stated above.

Further, when a material or the like is referred to, the referred material is a primary material and does not exclude a secondary element, an additive, an additional element, and the like except when the material is specified otherwise or regarded otherwise in principle or from the situation. For example, a silicon member, unless otherwise specified, includes not only pure silicon but also added impurities, binary and ternary alloys (for example, SiGa) containing silicon as the main element, and others.

Yet further, elements having identical functions are marked with an identical reference character in principle over the entire drawings used for the explanations of the present embodiments and the repetition of the explanations is avoided.

In addition, in the drawings used in the present embodiments, hatching is sometimes used partially in order to facilitate the visualization of a drawing even when the drawing is a plan view.

The embodiments according to the present invention are hereunder explained in detail in reference to the drawings.

Embodiment 1

An electronic device according to Embodiment 1 includes a PA used for a 5 GHz band wireless LAN for example. Then, a semiconductor device according to Embodiment 1 includes an RF bipolar transistor for the PA. In Embodiment 1, a 5 GHz band means a frequency band of 5.0 to 6.0 GHz. Then in the 5 GHz band, the frequencies of 5.2 and 5.8 GHz are generally used and 5.8 GHz is used for a wireless LAN in most cases. An electronic device and a semiconductor device according to Embodiment 1 are explained in accordance with the manufacturing processes.

Figure 2:
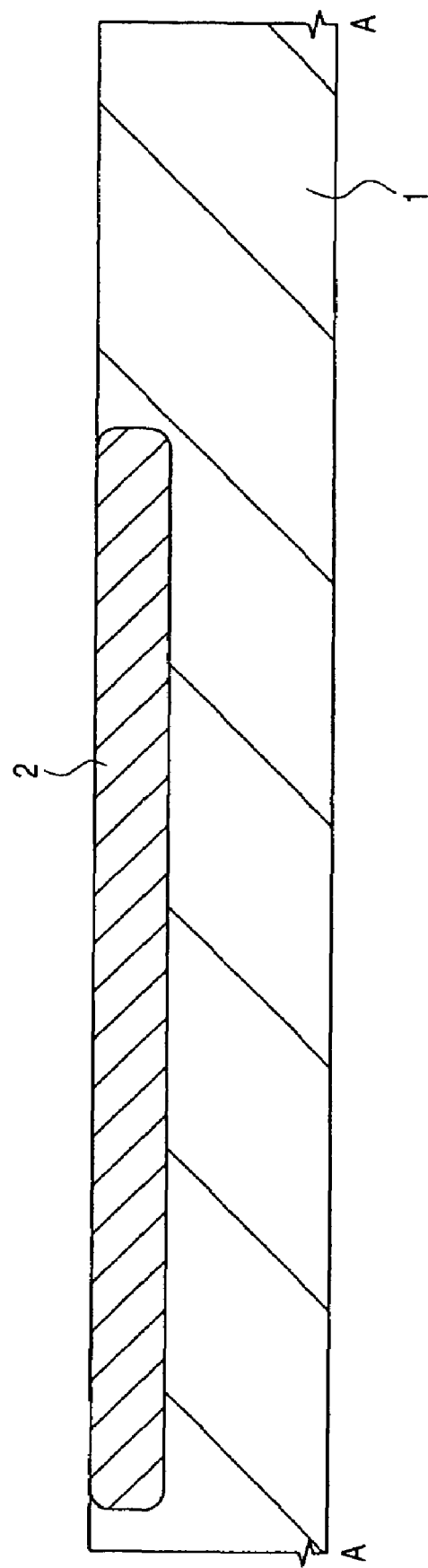
FIG. 2 is a sectional view of the substantial part explaining the manufacturing method of the semiconductor device according to Embodiment 1 of the present invention.

Firstly as shown in FIGS. 1 and 2, for example, an n+ type collector embedded region (a first semiconductor layer) 2 is formed over a substrate 1 comprising p+ type silicon by the ion implantation method and the thermal diffusion method through a photolithography (hereunder referred to simply as "lithography") process. Here, FIG. 2 shows a section taken on line A-A in FIG. 1. On this occasion, As (arsenic) and Sb (antimony) which are adequate to form a shallow junction with a high concentration are used in order to lower the resistance of the collector embedded region 2. By so doing, the resistance of the collector embedded region 2 can be lowered and hence the corrector resistance can be lowered.

Here, in Embodiment 1, when the term "substrate" or the term "substrate 1" is used, the term means only a substrate 1.

Figure 3:
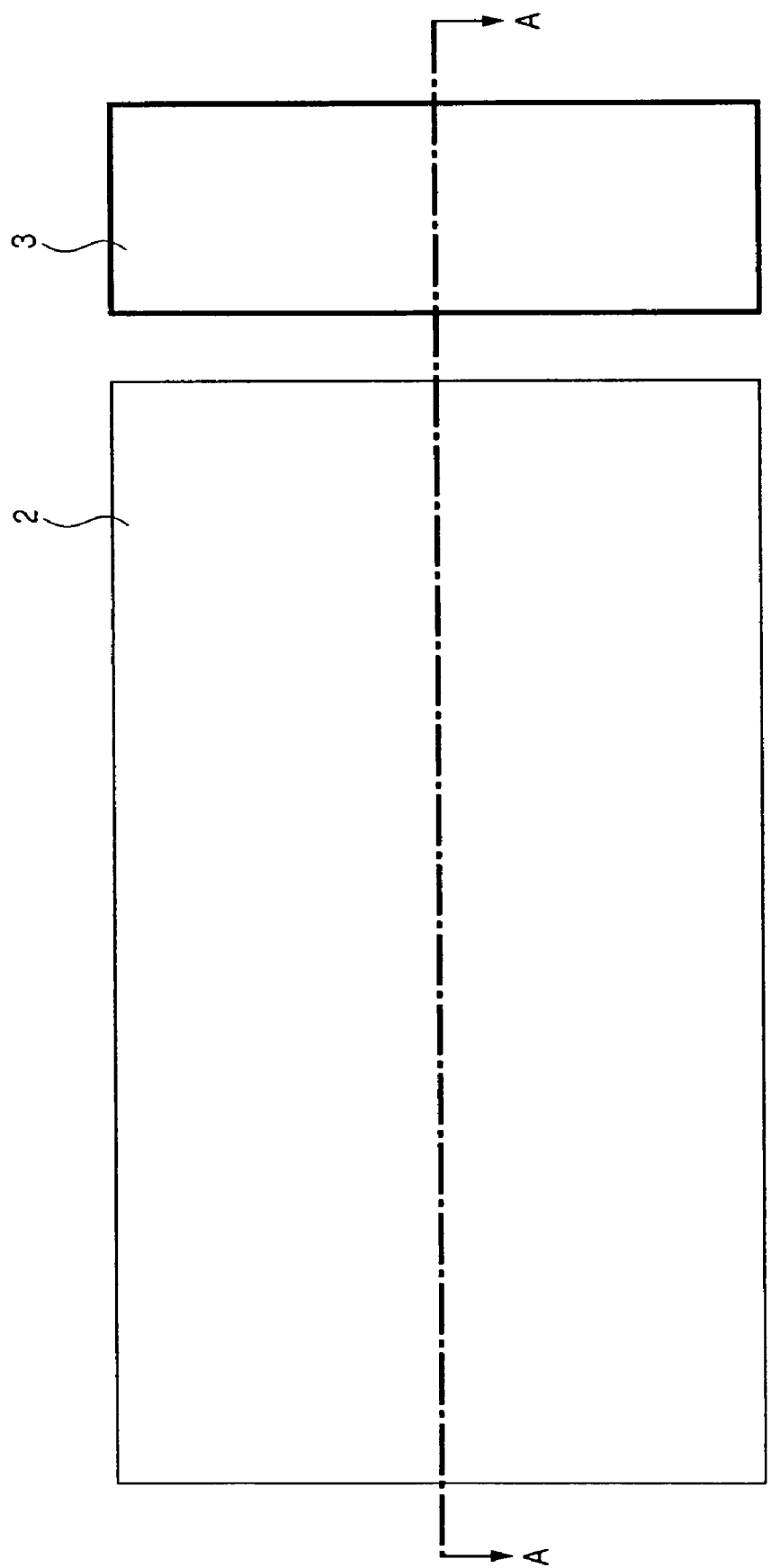
FIG. 3 is a plan view showing the substantial part of the semiconductor device in the manufacturing process succeeding to the manufacturing process shown in FIG. 1.
Figure 4:
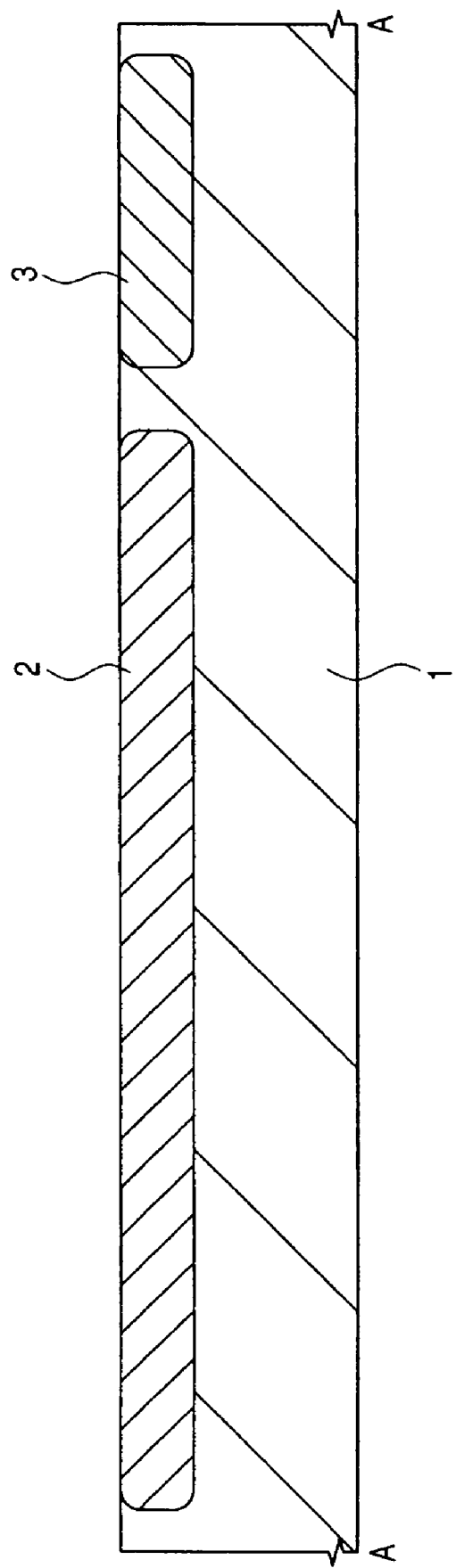
FIG. 4 is a sectional view showing the substantial part of the semiconductor device in the manufacturing process succeeding to the manufacturing process shown in FIG. 2.

Successively, as shown in FIGS. 3 and 4, a p+ type isolation region (a second semiconductor layer) 3 is formed by the ion implantation method and the thermal diffusion method through a lithography process in order to isolate the isolation region 3 from the n+ type collector embedded region 2. The impurity concentration of the isolation region 3 is controlled to an optimum value since the impurity concentration functions as a parameter that determines the capacitance between a collector and the substrate 1.

Figure 5:
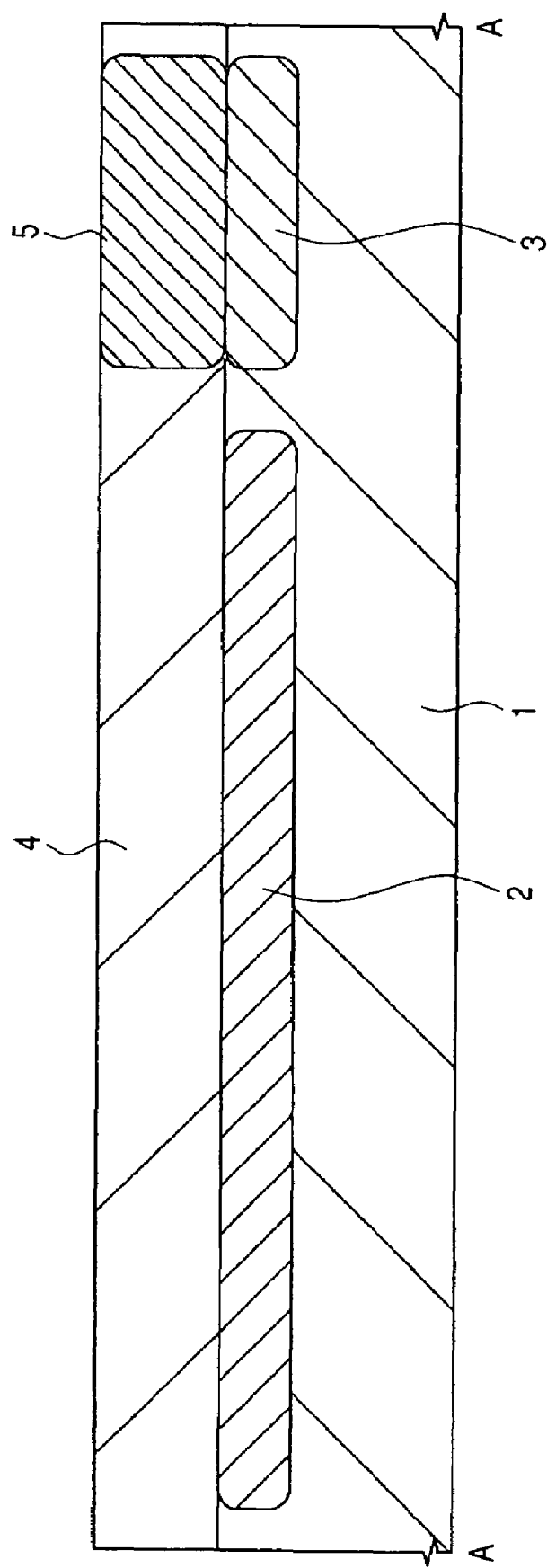
FIG. 5 is a sectional view showing the substantial part of the semiconductor device in the manufacturing process succeeding to the manufacturing process shown in FIG. 4.

Successively, as shown in FIG. 5, an n type Si epitaxial layer is formed over the main surface of the substrate 1 by the epitaxial method and thereby an n type collector region 4 is formed. On this occasion, in consideration of isolation between the p type isolation region 3 and active regions enclosed by the n type collector region 4, the impurity concentration of the n type collector region 4 is lowered. This is because, if the impurity concentration of the n type collector region 4 is high, the p type isolation region 3 is inverted into an n type and the isolation may not be secured undesirably. Therefore, the optimization of the impurity concentration of the n type collector region 4 is important. Thereafter, for the isolation of the active regions, a p type isolation region 5 is formed by the ion implantation method and the thermal diffusion method through a lithography process.

Figure 6:
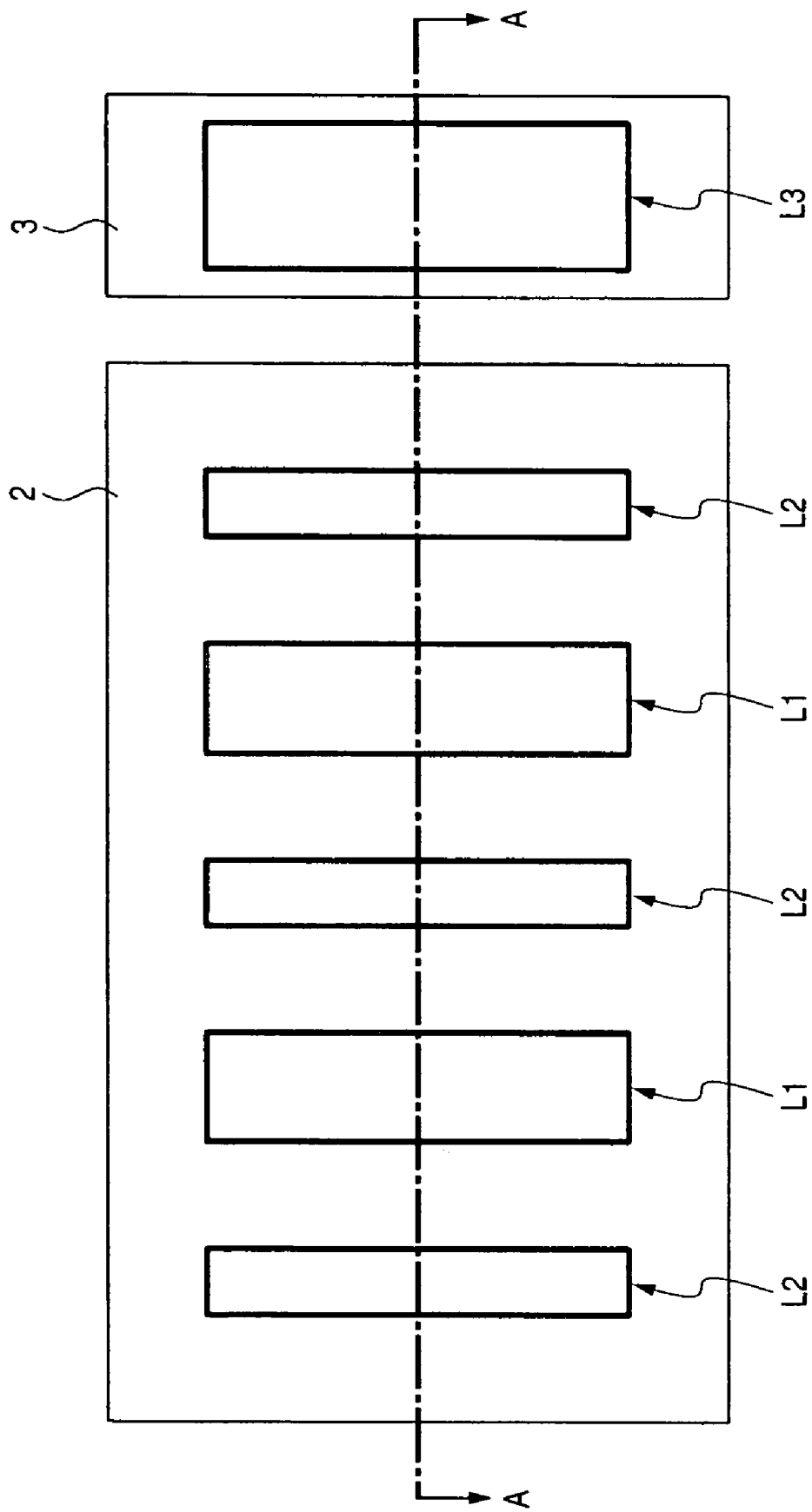
FIG. 6 is a plan view showing the substantial part of the semiconductor device according to Embodiment 1 of the present invention in a manufacturing process.
Figure 7:
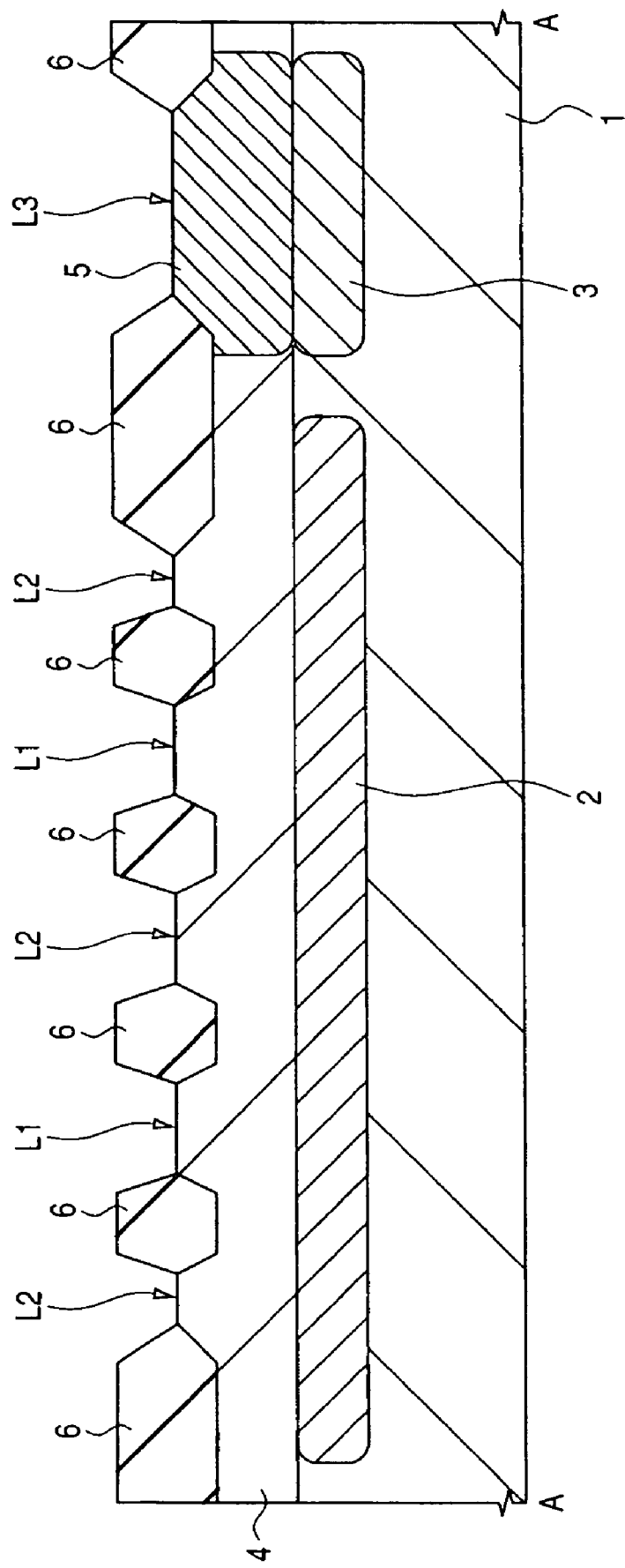
FIG. 7 is a sectional view showing the substantial part of the semiconductor device in the manufacturing process succeeding to the manufacturing process shown in FIG. 5.

Successively, as shown in FIGS. 6 and 7, an isolation section 6 is formed over the top surface of the epitaxial layer and thereby the active layers are formed at the top surface section of the epitaxial layer. On this occasion, an active region L1 for an emitter-base junction region, an active region L2 for a collector extraction region, and an active region L3 for the electrical conduction to the substrate 1 are formed simultaneously. In Embodiment 1, a so-called enclosure type collector layout, wherein the n type collector region 4, a p type base region, a p+ type base extraction region, and an emitter region are enclosed with the n+ type collector embedded region 2 and an n+ type collector extraction region, is adopted. By so doing, it is possible to increase the route of the electric current flowing from the collector to the base as stated above and to alleviate the current crowding, and hence the reduction of the collector resistance and the improvement of resistance to element destruction can be realized simultaneously. Here, the p type base region, the p+ type base extraction region, the emitter region, and the n+ type collector extraction region are the regions which are formed in succeeding processes and are described in detail when relevant processes are explained.

Figure 8:
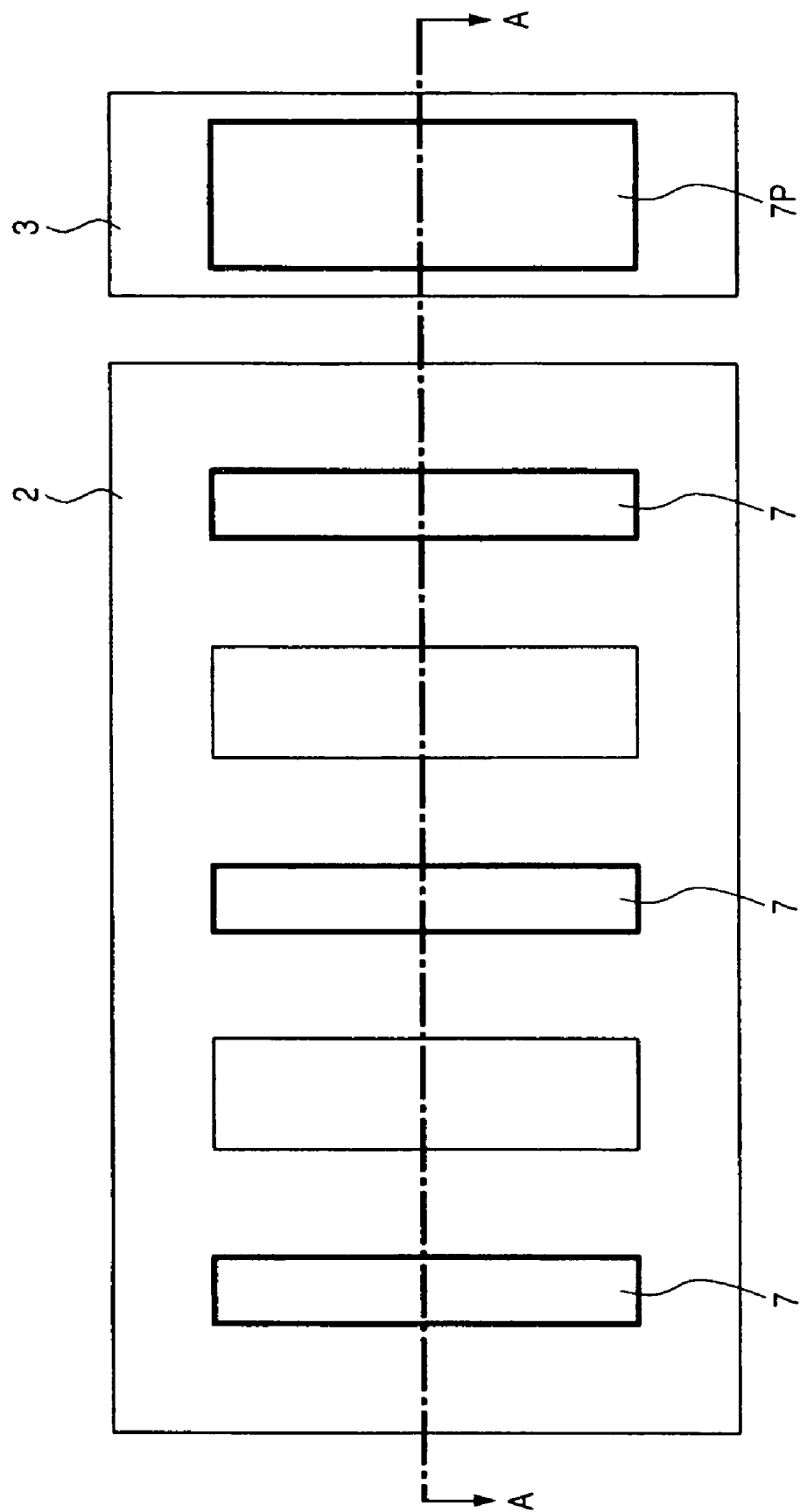
FIG. 8 is a plan view showing the substantial part of the semiconductor device in the manufacturing process succeeding to the manufacturing process shown in FIG. 6.
Figure 9:
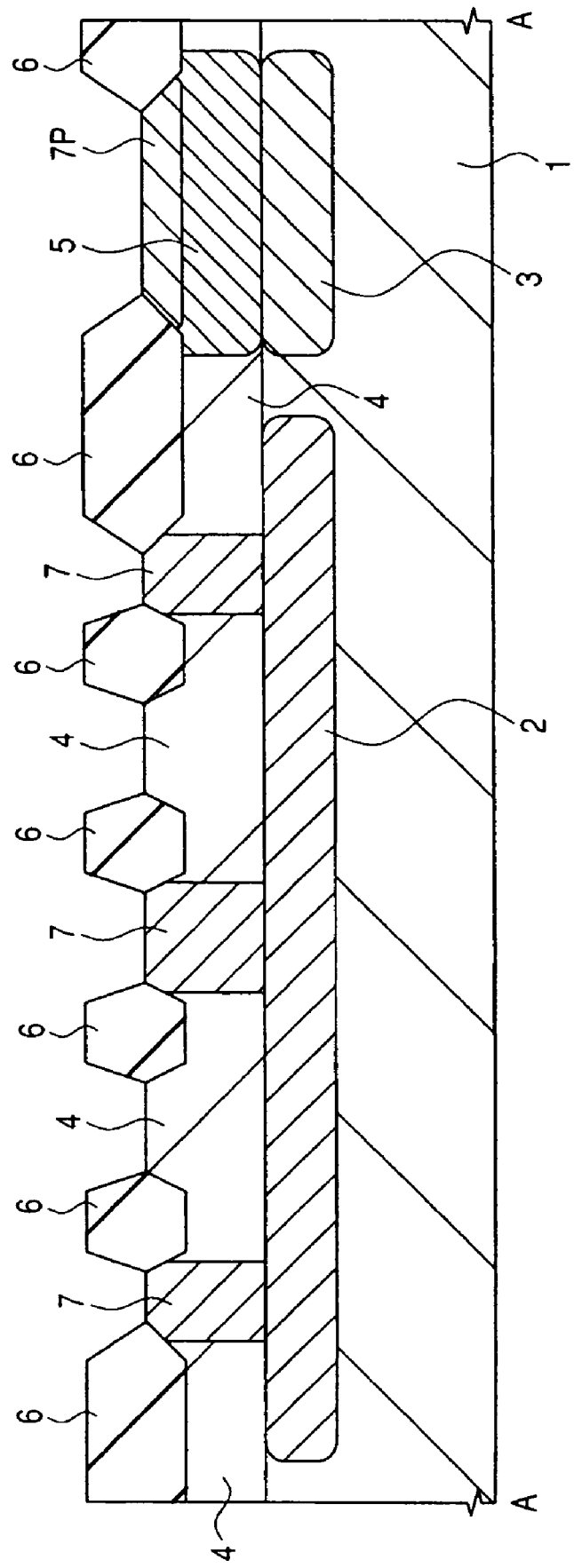
FIG. 9 is a sectional view showing the substantial part of the semiconductor device in the manufacturing process succeeding to the manufacturing process shown in FIG. 7.

Successively, as shown in FIGS. 8 and 9, an n+ type collector extraction region (a fifth semiconductor layer) 7 is formed by the ion implantation method and the like through a lithography process. On this occasion, the collector extraction region 7 has to be formed so as to extend from the top surface of the collector region 4 and reach the collector embedded region 2 and hence P (phosphorous) having a large diffusion coefficient for example is used as an impurity to form the collector extraction region 7. Further, the resistance of the collector extraction region 7 has to be lowered since it influences the collector resistance. Subsequently, a p+ type semiconductor region 7P is formed by the ion implantation method and the like through a lithography process.

Figure 10:
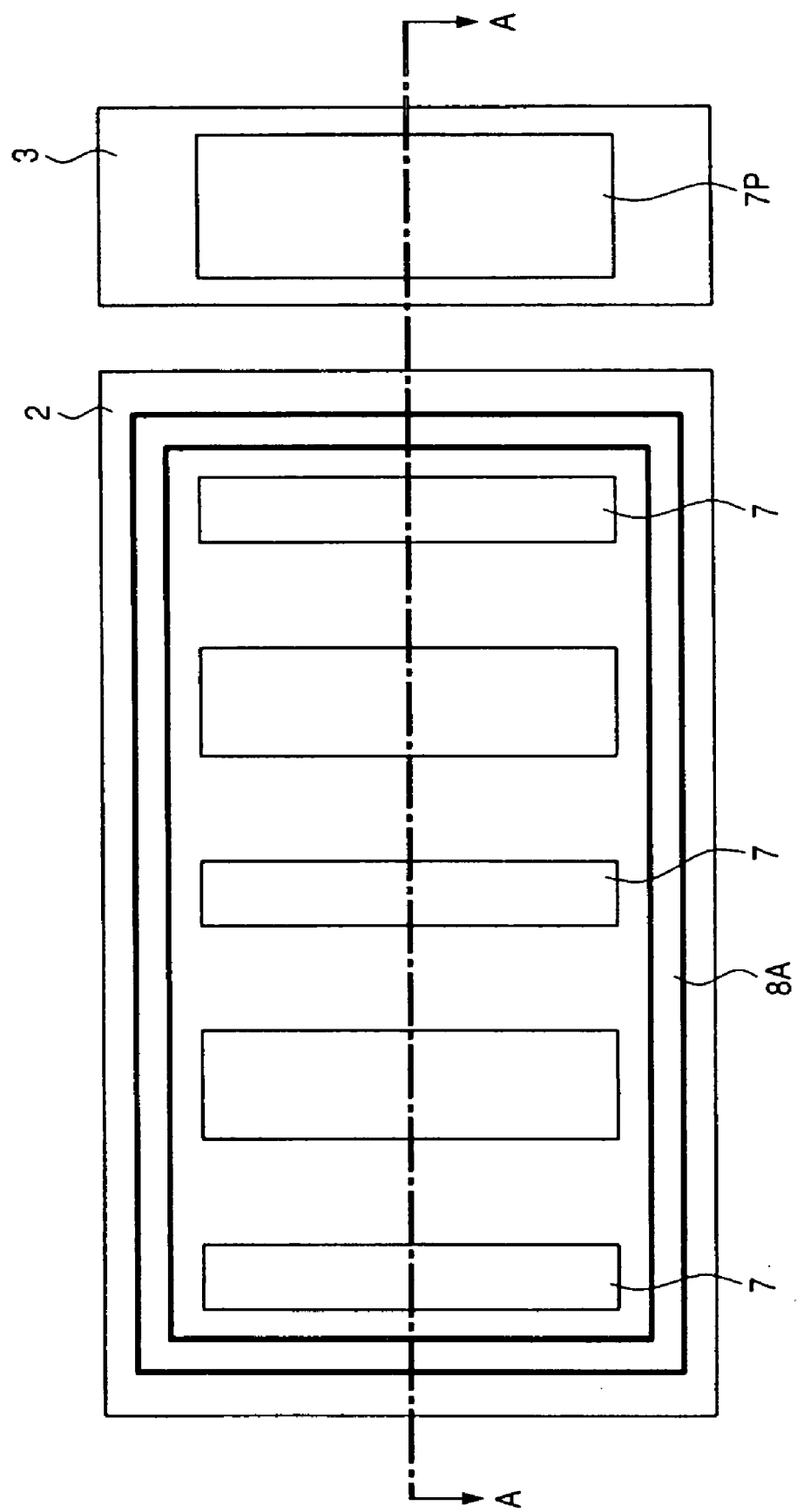
FIG. 10 is a plan view showing the substantial part of the semiconductor device in the manufacturing process succeeding to the manufacturing process shown in FIG. 8.
Figure 11:
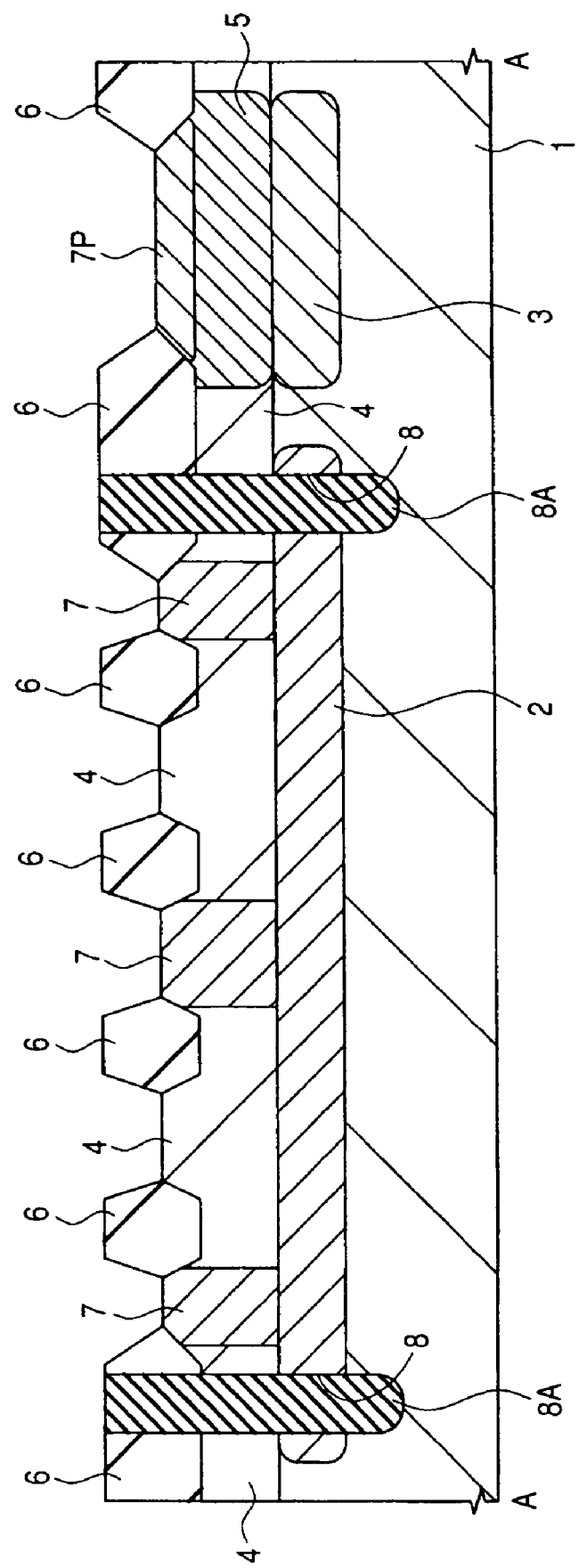
FIG. 11 is a sectional view showing the substantial part of the semiconductor device in the manufacturing process succeeding to the manufacturing process shown in FIG. 9.

Successively, as shown in FIGS. 10 and 11, through a lithography process, the isolation section 6, the collector region 4, the collector embedded region 2, and a part of the substrate 1 are etched and thus a groove (a second groove) 8 which penetrates the isolation section 6, the collector region 4, and the collector embedded region 2 and reaches the substrate 1 is formed so as to enclose the collector extraction region 7 in a plan view. Further, the groove 8 is formed so as to engrave a part of the substrate 1. Subsequently, a thin silicon oxide film is formed on the inner wall of the groove 8 by applying thermal oxidation treatment to the substrate 1. Successively, a BPSG (Boron-Phospho Silicate Glass) film is deposited over the substrate 1 and the BPSG film is embedded in the groove 8. Thereafter, an isolation section (a first dielectric film) 8A is formed by removing the BPSG film outside the groove 8 and keeping the BPSG film in the groove 8. By forming the isolation section 8A, it is possible to lower the capacitance between the collector and the substrate. This will be described later in detail.

Figure 12:
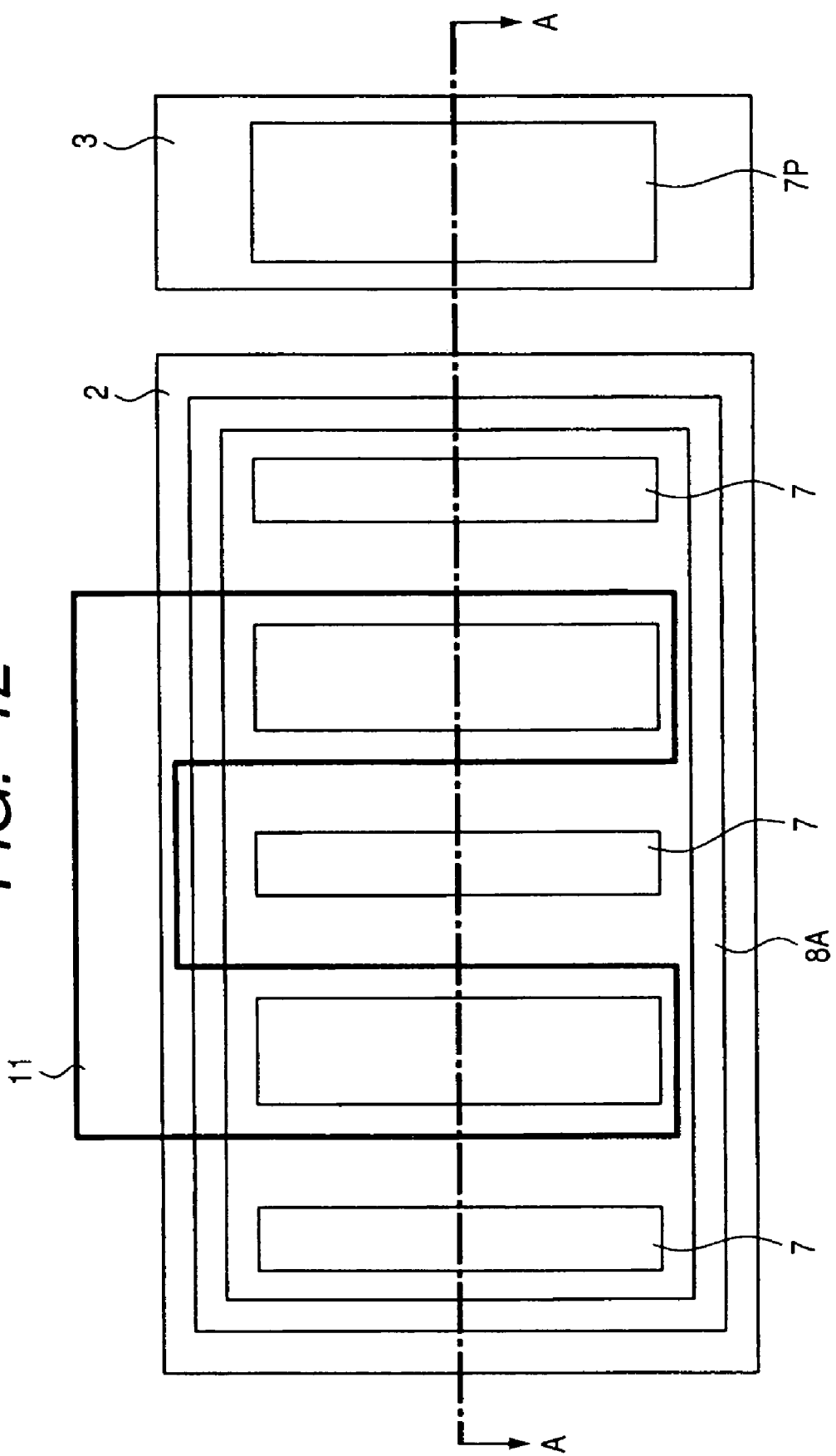
FIG. 12 is a plan view showing the substantial part of the semiconductor device in the manufacturing process succeeding to the manufacturing process shown in FIG. 10.
Figure 13:
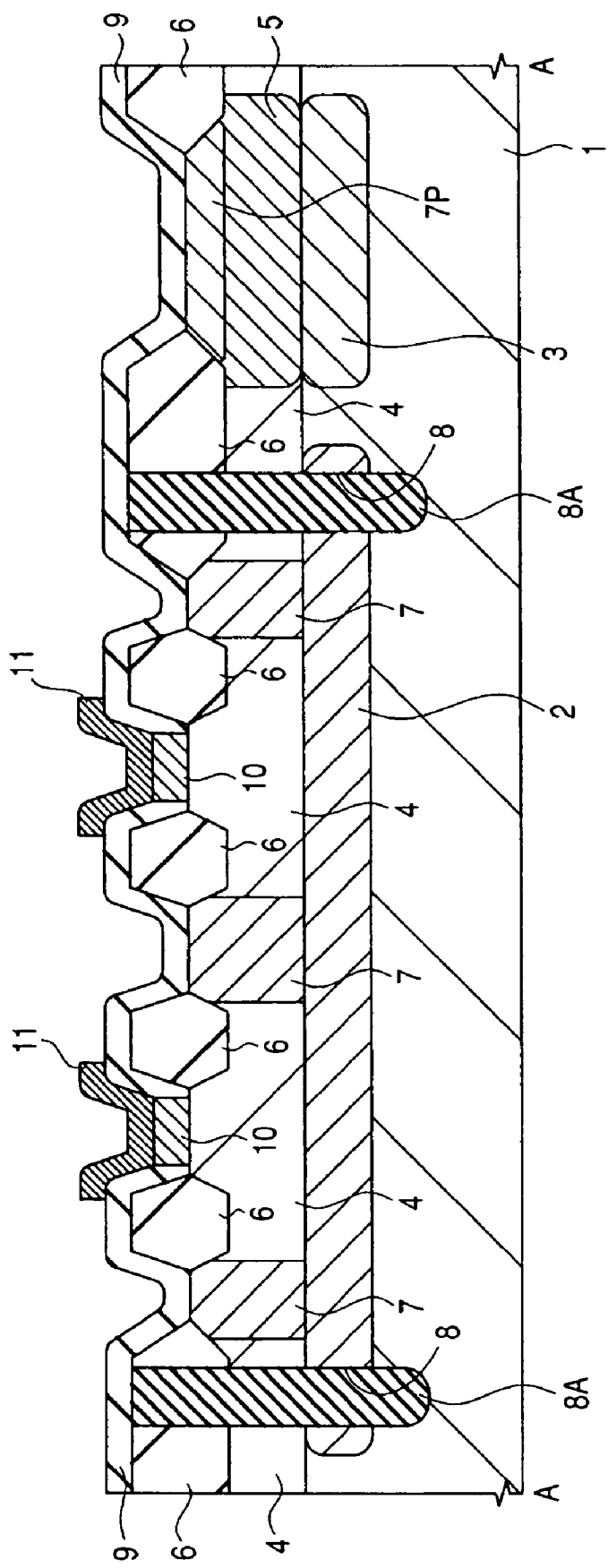
FIG. 13 is a sectional view showing the substantial part of the semiconductor device in the manufacturing process succeeding to the manufacturing process shown in FIG. 11.

Successively, as shown in FIGS. 12 and 13, after a silicon oxide film 9 is deposited over the substrate 1, openings are formed by etching the parts, of the silicon oxide film 9, where the base region is formed. Subsequently, a heterojunction layer (a third semiconductor layer) 10 is formed in the openings by depositing an undoped SiGe (silicon germanium) layer, a p type SiGe layer, and an undoped silicon layer starting from the bottom through the epitaxial method for example.

Subsequently, after a polysilicon film into which a p type impurity (for example B (boron)) is introduced is deposited over the silicon oxide film 9 and the heterojunction layer 10, the polysilicon film is patterned in a lithography process and a base extraction electrode (a first electrode) 11 is formed.

In the meantime, in Embodiment 1, the aforementioned groove 8 and isolation section 8A may be formed at any time as long as they are formed after the isolation section 6 is formed and before the base extraction electrode 11 is formed. Since the groove 8 and the isolation section 8A are formed so as to match the positions of the active regions L1 and L2, if the groove 8 and the isolation section 8A are tried to be formed after the base extraction electrode 11 is formed in the case where the miniaturization of the patterns of members including the base extraction electrode 11 advances, it becomes difficult to match the positions of the members including the active regions L1 and L2, the groove 8 (the isolation section 8A), and the base extraction electrode 11 with each other. Thus, by forming the groove 8 and the isolation section 8A after the active regions L1 and L2 having relatively large patterns are set and before the base extraction electrode 11 is formed, the allowances of the position matching of the members can be secured and hence it becomes possible to conform to the miniaturization of the members. Further, it is preferable that the groove 8 and the isolation section 8A are formed under the situation where the unevenness above the substrate 1 is small.

Figure 14:
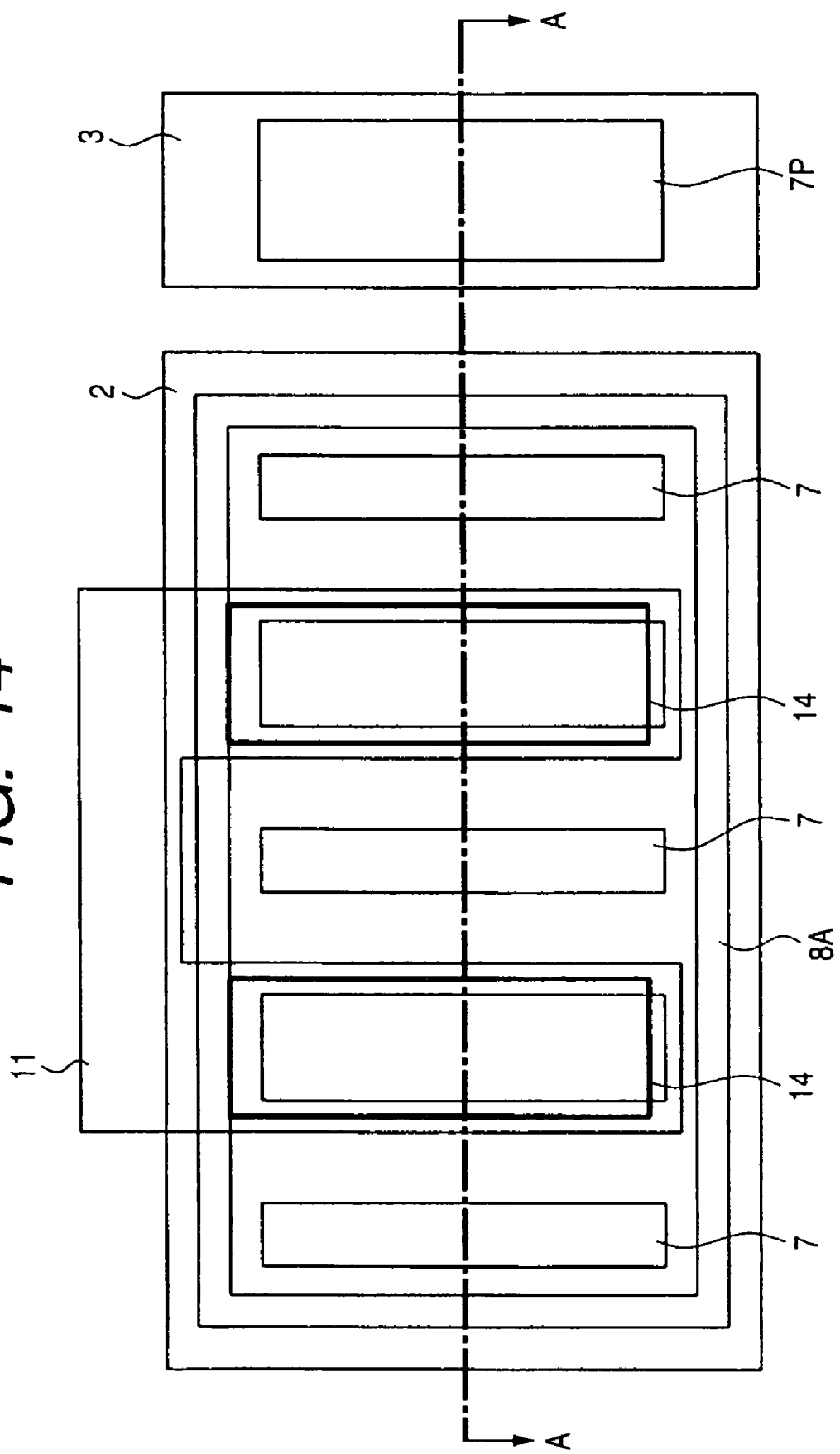
FIG. 14 is a plan view showing the substantial part of the semiconductor device in the manufacturing process succeeding to the manufacturing process shown in FIG. 12.
Figure 15:
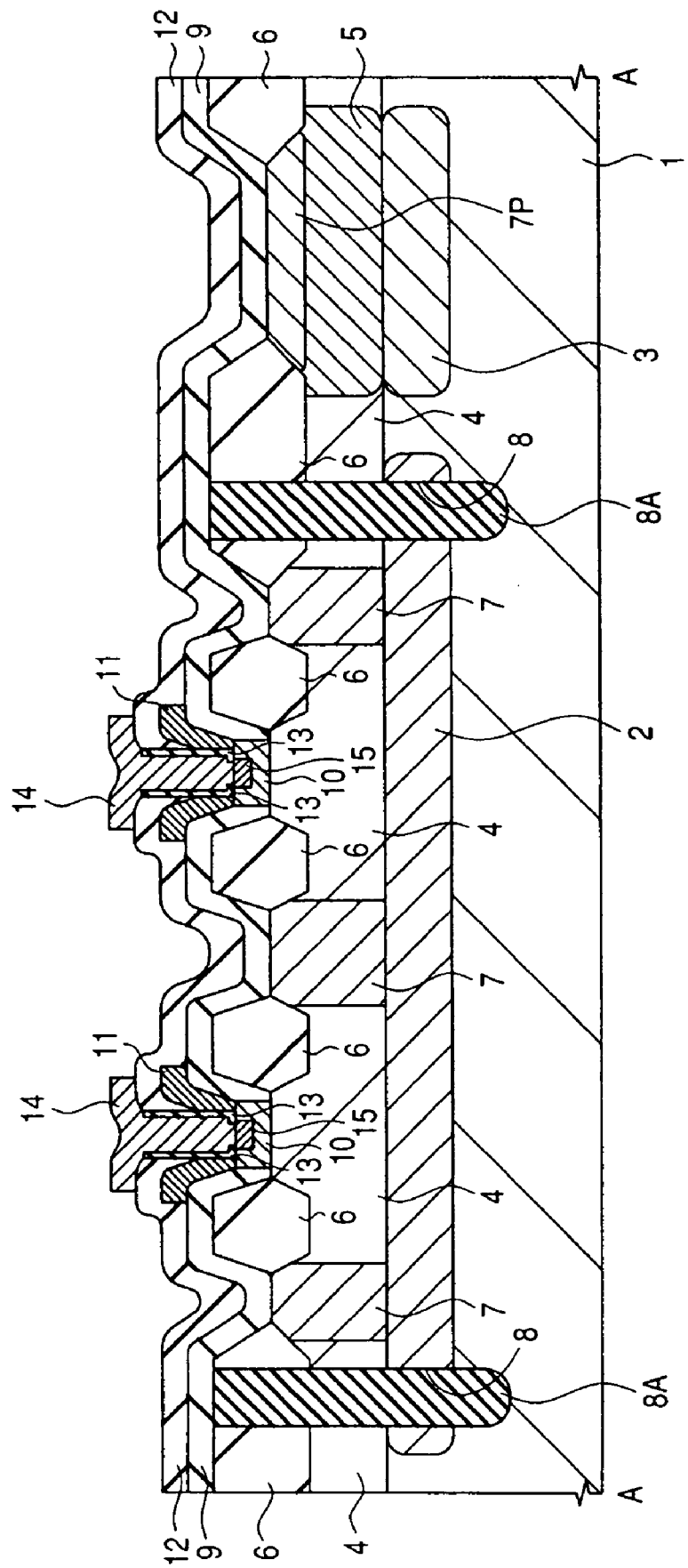
FIG. 15 is a sectional view showing the substantial part of the semiconductor device in the manufacturing process succeeding to the manufacturing process shown in FIG. 13.

Successively, as shown in FIGS. 14 and 15, for example, a silicon oxide film 12 is deposited by the thermal CVD (Chemical Vapor Deposition) method, thereafter the silicon oxide film 12 is patterned in a lithography process, and thereby openings are formed on the heterojunction layer 10. Subsequently, a silicon nitride film 13 is deposited over the silicon oxide film 12 including the interior of the openings, thereafter the silicon nitride film 13 is patterned in a lithography process, and thus the silicon nitride film 13 is retained at parts of the bottom surfaces and the side walls of the openings. Subsequently, a polysilicon film into which an n type impurity (for example As or P) is introduced is deposited over the substrate 1, thereafter the polysilicon film is patterned in a lithography process, and thus emitter extraction electrodes (second electrodes) 14 are formed. IDP (In Situ phosphorus-Doped Polysilicon) for example is used for the n type polysilicon film which forms the emitter extraction electrodes 14 and thereby the temperature dependency of the current amplification factor of a bipolar transistor is taken into consideration. The purpose is to decrease or prevent element destruction caused by heat which is important in the application of a high power device by using an IDP film which is excellent in the temperature dependency. Subsequently, by applying heat treatment to the substrate 1, the impurity is diffused from the emitter extraction electrodes 14 and an n+ type emitter region (a fourth semiconductor layer) 15 is formed over the heterojunction layer 10 in a self aligned manner.

Further, as shown in FIG. 12, by forming the base extraction electrode 11 into a U-shape in a plan view, it is possible to lower the MOS capacitance between the base and the collector and the collector resistance under the base extraction electrode 11. By so doing, the improvements of the power gain, the cutoff frequency, and the 1 dB gain compression output power of an RF bipolar transistor according to Embodiment 1 can be obtained at the same time.

Figure 16:
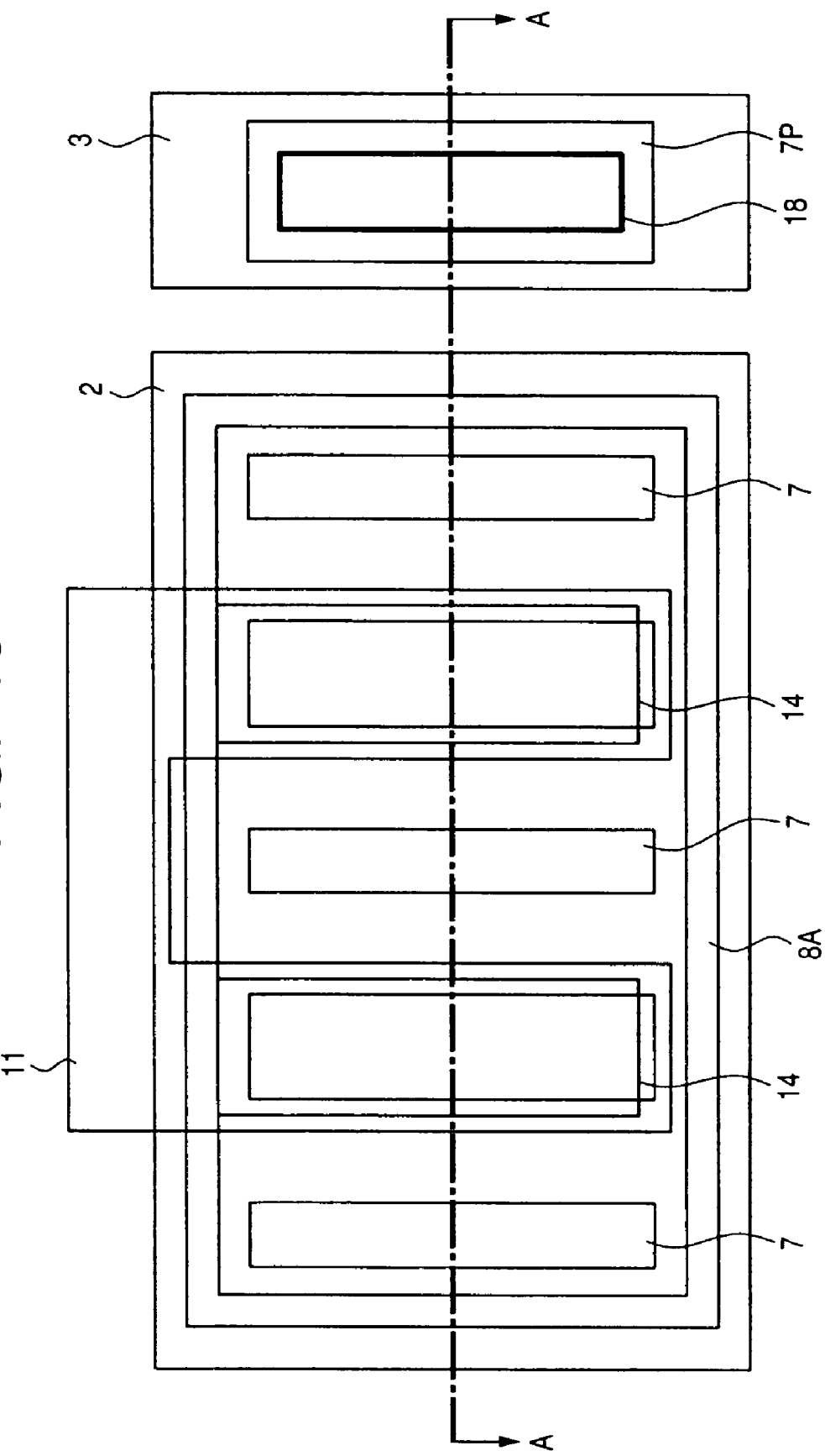
FIG. 16 is a plan view showing the substantial part of the semiconductor device in the manufacturing process succeeding to the manufacturing process shown in FIG. 14.
Figure 17:
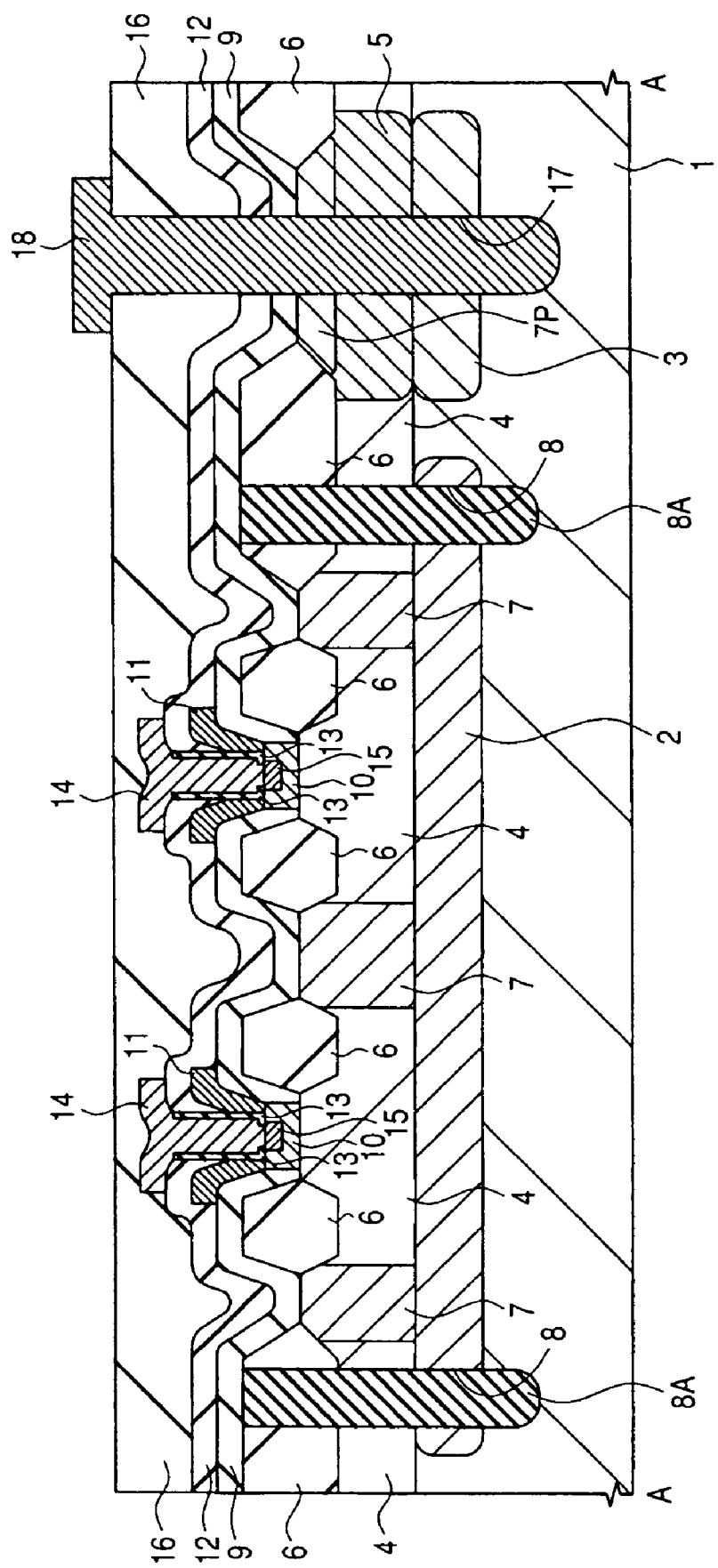
FIG. 17 is a sectional view showing the substantial part of the semiconductor device in the manufacturing process succeeding to the manufacturing process shown in FIG. 15.

Successively, as shown in FIGS. 16 and 17, for example, a dielectric film (a second dielectric film) 16 is formed by depositing a silicon oxide film over the substrate 1 through the CVD method or another method. Subsequently, through a lithography process, the dielectric film 16, the silicon oxide films 12 and 9, the semiconductor region 7P, the isolation regions 5 and 3, and a part of the substrate 1 are etched and thus a groove (a first groove) 17 that penetrates the dielectric film 16, the silicon oxide films 12 and 9, the semiconductor region 7P, and the isolation regions 5 and 3 and reaches the substrate 1 is formed. In this case, the groove 17 is formed so as to engrave a part of the substrate 1. By forming the groove 17 after the dielectric film 16 is formed, it is possible to protect the emitter extraction electrodes 14 with the dielectric film 16 and hence it is possible to prevent the emitter extraction electrodes 14 from being damaged by the etching at the forming of the groove 17. Subsequently, for example, a thin TiN (titanium nitride) film is deposited over the dielectric film 16 including the interior of the groove 17 by the sputtering method. Successively, for example, a W (tungsten) film is deposited over the dielectric film 16 including the interior of the groove 17 by the CVD method and thus the W film is embedded in the groove 17. Thereafter, the W film and the TiN film outside the groove 17 are removed and the W film and the TiN film are retained inside the groove 17, and thereby an electrically conductive layer (a first electrically conductive film) 18 having the W film as the main electrically conductive layer is formed. Although explanations have been made on the basis of the case where the electrically conductive layer 18 is formed with the TiN film and the W film in Embodiment 1, a polysilicon film wherein a p type impurity is doped may be embedded in the groove 17 in place of the TiN film and the W film.

Figure 18:
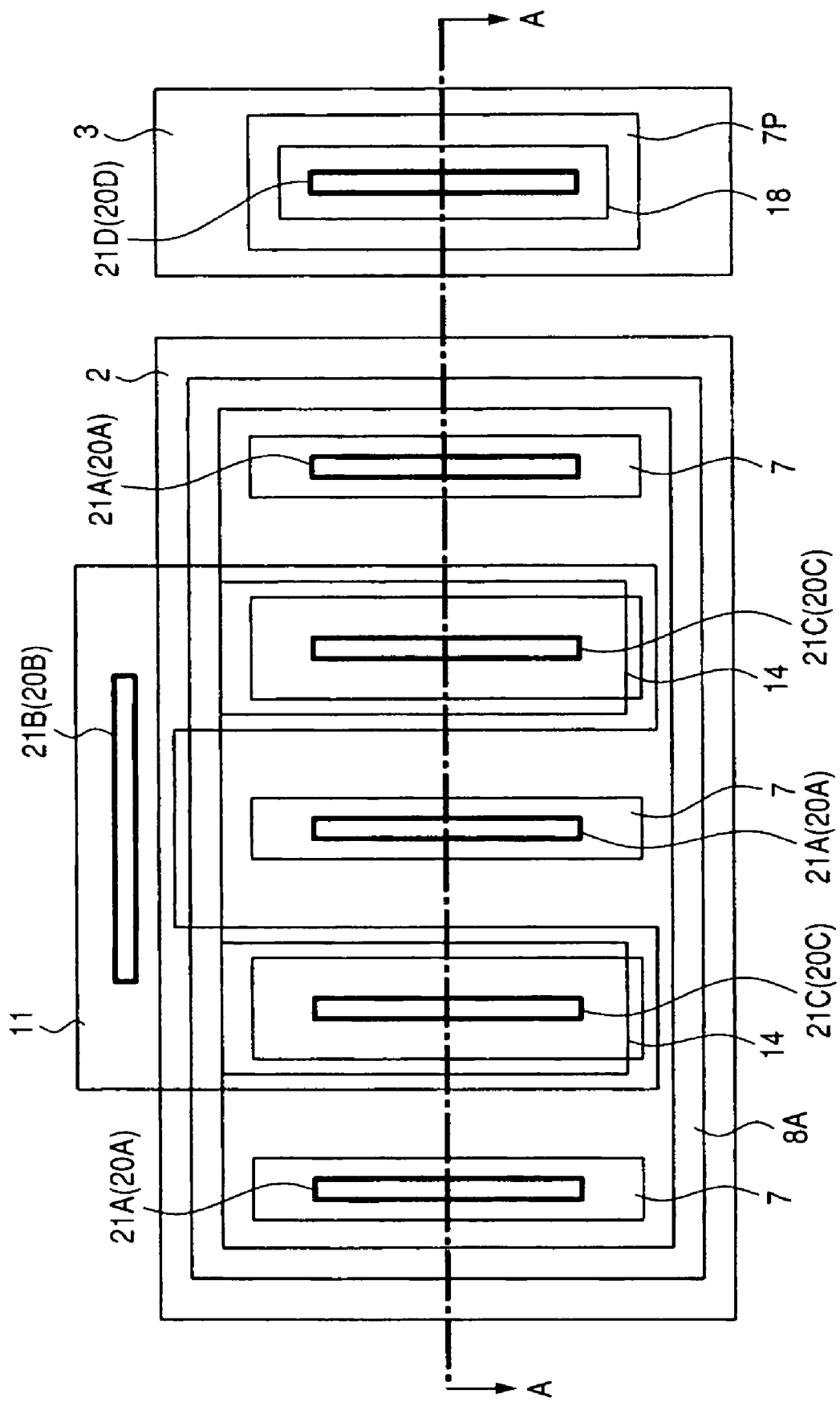
FIG. 18 is a plan view showing the substantial part of the semiconductor device in the manufacturing process succeeding to the manufacturing process shown in FIG. 16.
Figure 19:
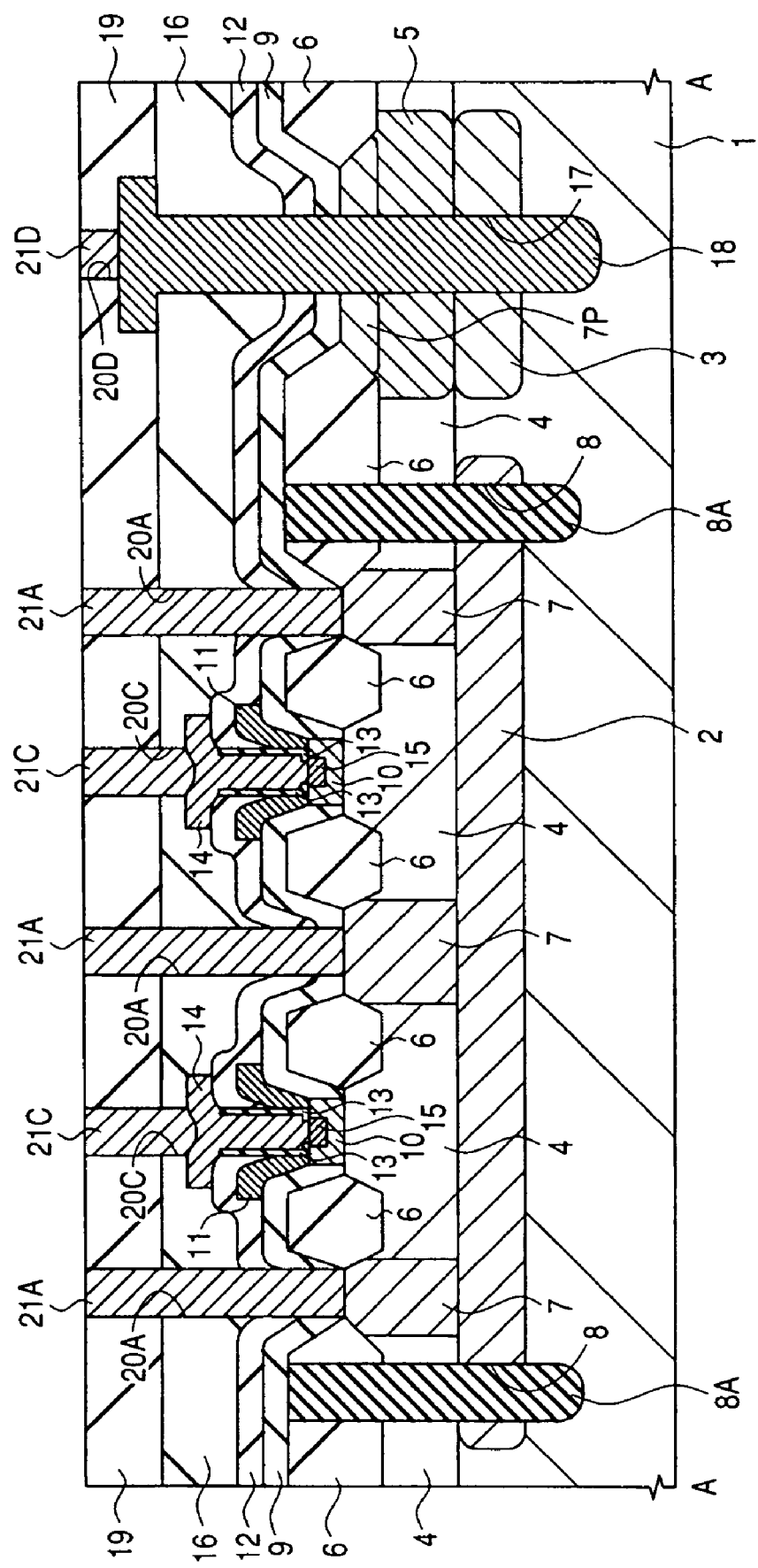
FIG. 19 is a sectional view showing the substantial part of the semiconductor device in the manufacturing process succeeding to the manufacturing process shown in FIG. 17.

Successively, as shown in FIGS. 18 and 19, for example, a dielectric film 19 is formed by depositing a silicon oxide film over the substrate 1 through the CVD method or the like. Subsequently, the dielectric film 19 is patterned through a lithography process and contact holes 20A reaching the collector extraction region 7, a contact hole 20B reaching the base extraction electrode 11, contact holes 20C reaching the emitter extraction electrodes 14, and a contact hole 20D reaching the electrically conductive layer 18 are formed. Subsequently, for example, a thin TiN film is deposited over the substrate 1 including the interiors of the contact holes 20A, 20B, 20C, and 20D, thereafter a W film is deposited over the substrate 1, and thus the W film is embedded in the contact holes 20A, 20B, 20C, and 20D. Subsequently, the W film and the TiN film outside the contact holes 20A, 20B, 20C, and 20D are removed by the CMP method and plugs (third electrodes) 21A electrically connected to the collector extraction region 7, a plug 21B electrically connected to the base extraction electrode 11, plugs 21C electrically connected to the emitter extraction electrodes 14, and a plug 21D electrically connected to the electrically conductive layer 18 are formed.

Figure 20:
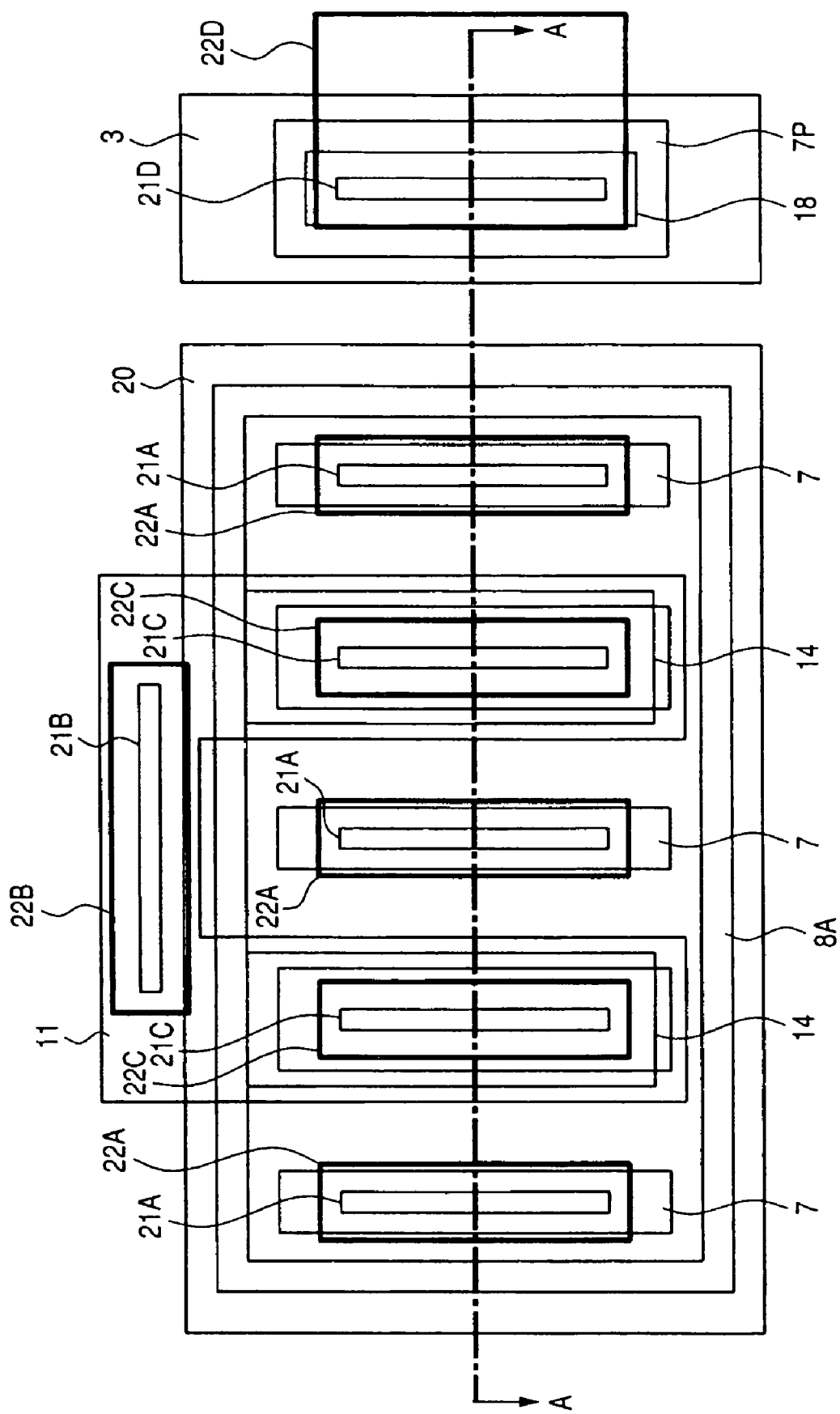
FIG. 20 is a plan view showing the substantial part of the semiconductor device in the manufacturing process succeeding to the manufacturing process shown in FIG. 18.
Figure 21:
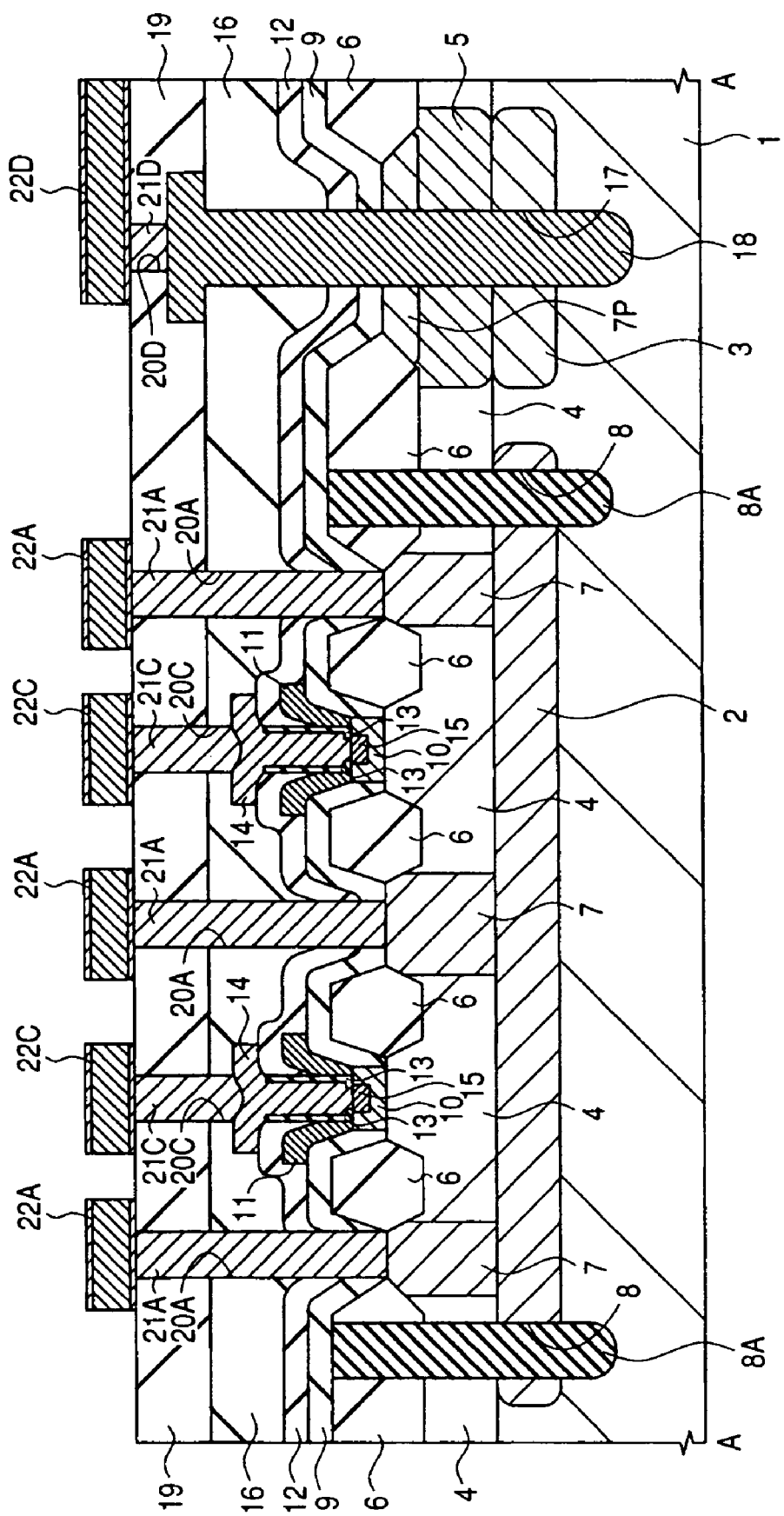
FIG. 21 is a sectional view showing the substantial part of the semiconductor device in the manufacturing process succeeding to the manufacturing process shown in FIG. 19.

Successively, as shown in FIGS. 20 and 21, for example, a laminated film is formed by depositing a titanium nitride film, an Al (aluminum) film, and another titanium nitride film sequentially over the substrate 1 and thereafter a first wiring layer is formed by patterning the laminated film through a lithography process. By so doing, wirings 22A, 22B, 22C, and 22D electrically connected to the plugs 21A, 21B, 21C, and 21D respectively are formed.

Figure 22:
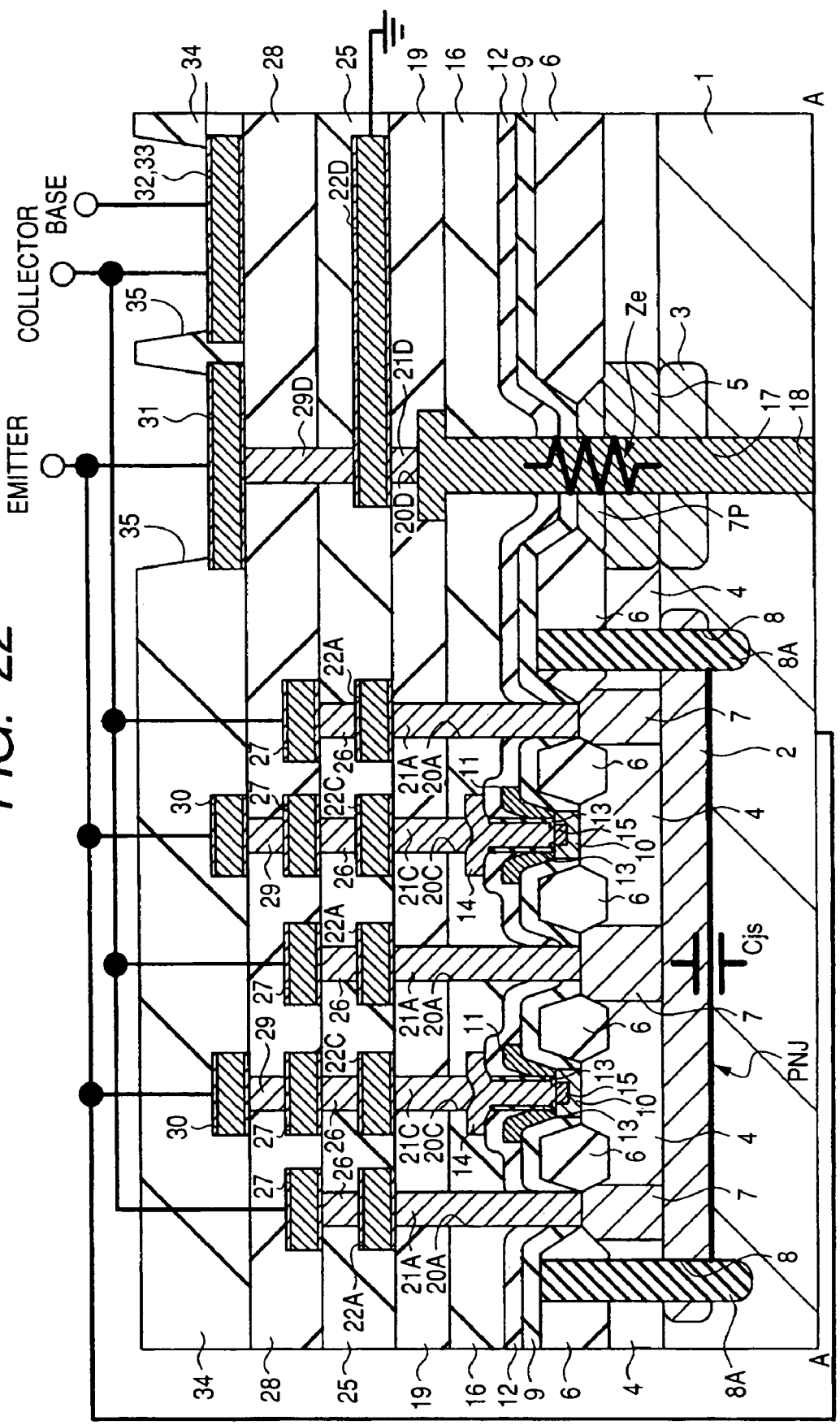
FIG. 22 is a sectional view showing a substantial part of a semiconductor device according to Embodiment 1 of the present invention in a manufacturing process.

Successively, as shown FIG. 22, for example, a dielectric film 25 is formed by depositing a silicon oxide film over the substrate 1 through the CVD method or the like. Subsequently, the dielectric film 25 is patterned in a lithography process, thus contact holes reaching the first wiring layer are formed, and thereafter plugs 26 similar to the aforementioned plugs 21A to 21D are formed in the contact holes. Successively, through processes similar to the processes through which the wirings 22A to 22D are formed, a second wiring layer including wirings 27 electrically connected to the plugs 26 is formed.

Subsequently, for example, a dielectric film 28 is formed by depositing a silicon oxide film over the substrate 1 through the CVD method or the like, thereafter the dielectric film 28 is patterned in a lithography process, thus contact holes reaching the wirings 27 are formed, and thereafter plugs 29 similar to the aforementioned plugs 21A to 21D and 26 are formed in the contact holes. On this occasion, on the wiring 22D, the dielectric film 25 is also patterned and a plug 29D electrically connected to the wiring 22D is formed.

Subsequently, over the substrate 1, for example, a laminated film is formed by depositing a titanium nitride film and an Al film sequentially, thereafter the laminated film is patterned in a lithography process, and wirings 30 electrically connected to the wirings 27, emitter pads 31 electrically connected to an emitter, a base pad 32 electrically connected to a base, and collector pads 33 electrically connected to a collector are formed. The emitter pads 31, the base pad 32, and the collector pads 33 are disposed independently. The emitter pads 31 are electrically connected to the emitter extraction electrodes 14 electrically connected to the emitter region 15 via the wirings 30, 27, and 22C and the plugs 29, 26, and 21C. The base pad 32 is electrically connected to the base extraction electrode 11 electrically connected to the heterojunction layer 10 via the wirings 30, 27, and 22B and the plugs 29, 26, and 21B not shown in FIG. 22. The collector pads 33 are electrically connected to the collector region 4 and the collector extraction region 7 via the wirings 30, 27, and 22A and the plugs 29, 26, and 21A. Further, the wirings 30 electrically connected to the emitter pads 31 and the emitter region 15 are electrically connected to the wiring 22D via the wirings 27 and the plugs 29 and 26 not shown in FIG. 22. Furthermore, the emitter pads 31 are electrically connected to the substrate 1 via the wiring. 22D, the plugs 29D and 21D, and the electrically conductive layer 18.

Figure 23:
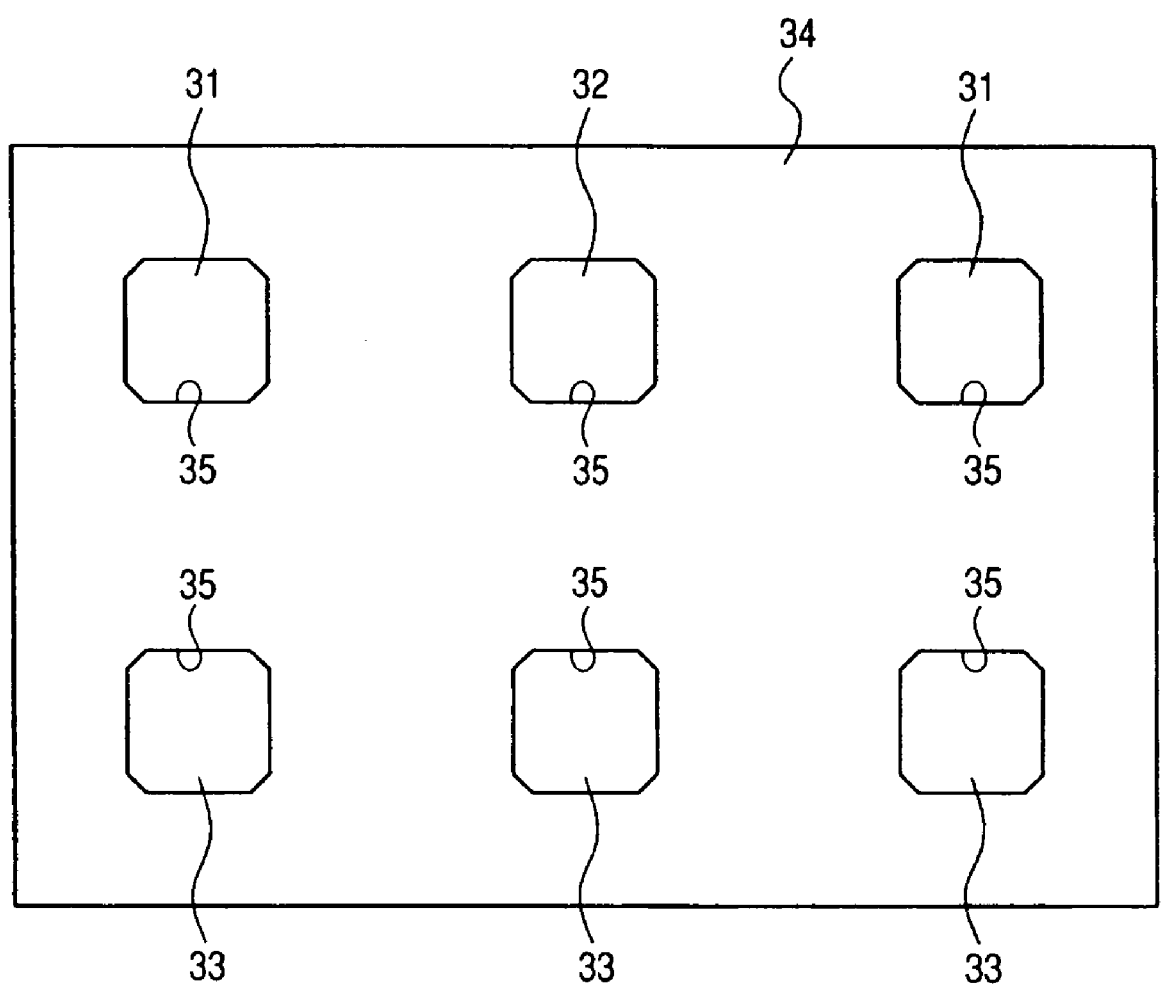
FIG. 23 is a plan view showing a substantial part of a semiconductor device according to Embodiment 1 of the present invention in a manufacturing process.

Successively, a dielectric film 34 for final surface protection is formed by depositing a silicon oxide film covering the wirings 30, the emitter pads 31, the base pad 32, and the collector pads 33 over the substrate 1. Subsequently, the dielectric film 34 is patterned in a lithography process and thus openings 35 reaching the emitter pads 31, the base pad 32, and the collector pads 33 respectively are formed (refer to FIG. 23). Here, FIG. 23 is a view showing a substantial part of the upper surface (a flat plane) of the substrate 1 when the openings 35 are formed. A bipolar transistor according to Embodiment 1 has a substrate emitter structure wherein the substrate 1 functions as an emitter and hence it is possible to extract a collector electrode from the main surface of the chip (the device forming surface). By so doing, it is possible to dispose plural collector pads 33 as bonding pads for a collector and thus to increase the number of wires for the collector, and hence the impedance can be improved (reduced).

Successively, after the back surface of the substrate 1 is polished, an electrically conductive film made of Au (gold) or the like for example is deposited over the back surface by the vapor deposition method or the like. The polishing is carried out so that the final thickness of the chip may be reduced to about 100 μm in consideration of the improvement of heat dissipation capacity.

Figure 24:
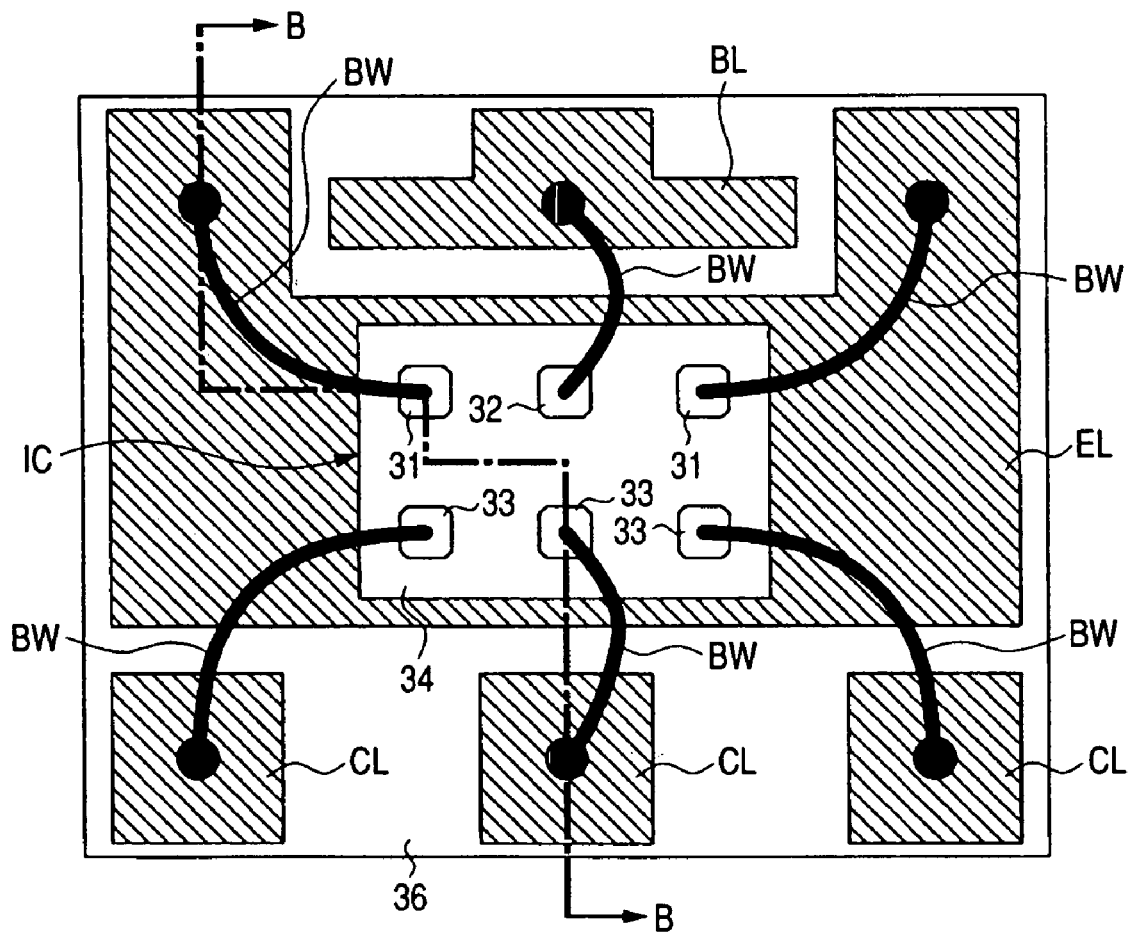
FIG. 24 is a plan view showing a substantial part of a semiconductor device according to Embodiment 1 of the present invention in a manufacturing process.
Figure 25:
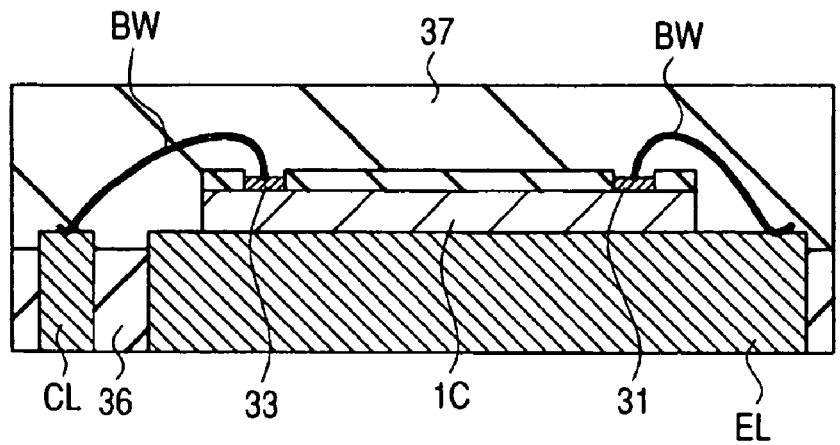
FIG. 25 is a sectional view showing a substantial part of the semiconductor device according to Embodiment 1 of the present invention in a manufacturing process.

Successively, the substrate 1 is divided into individual chips. Subsequently, as shown in FIGS. 24 and 25, a divided chip 1C is mounted on the main surface of a wiring board (a supporting substrate) in the state where the main surface (the device forming surface) of the chip faces upward and the back surface of the substrate 1 is brought in contact with an emitter wiring (a metal frame) EL of the wiring board. Here, FIG. 25 is a sectional view taken on line B-B in FIG. 24. Subsequently, with bonding wires BW, the base pad 32 is electrically connected to a base wiring (a metal frame) BL of the wiring board, the collector pads 33 are electrically connected to collector wirings (metal frames) CL of the wiring board, and the emitter pads 31 are electrically connected to the emitter wiring EL of the wiring board. The wiring board is configured so that the emitter wiring EL, the base wiring BL, and the collector wirings CL made of metal comprising mainly Fe (iron), Cu (copper), or the like may be embedded in a resin-made supporting substrate 36. Then the emitter wiring EL, the base wiring BL, and the collector wirings CL penetrate the supporting substrate 36 from the top to the back thereof. By using a wiring board of such configuration, it is possible to dissipate the heat generated through high-frequency operation of the chip 1C from the back surface of the wiring board via the emitter wiring EL, the base wiring BL, and the collector wirings CL.

Successively, the surface, of the wiring board, on which the chip is mounted is sealed with molding resin 37 and an electronic device or a semiconductor device according to Embodiment 1 is manufactured.

In an RF bipolar transistor according to Embodiment 1, the wiring 22D electrically connected to the emitter pads 31, the electrically conductive layer 18, and the substrate 1: is disposed also below the base pad 32 and the collector pads 33; and is electrically connected to a reference potential (a ground potential). By so doing, in an RF bipolar transistor according to Embodiment 1, the emitter may be used as the reference potential. The wirings 30, 27, and 22C electrically connected to the emitter can also take the reference (ground) potential. In contrast, in the case where the wiring 22D electrically connected to the emitter (the reference (ground) potential) is not disposed at the bottom parts of the base pad 32 and the collector pads 33, a CR series circuit comprising capacitance C and resistance R is disposed between: the base pad 32 and the collector pads 33; and the substrate 1. When such a CR series circuit is disposed, the CR series circuit acts as impedance and consumes the electric power input into the RF bipolar transistor, and hence it is feared that high gain is prevented from being obtained. Further, the CR series circuit acts as impedance, consumes electric power, and thereby generates heat, the generated heat causes thermal noise, and hence it is feared that the noise is prevented from reducing. In view of the situation, by adopting such a pattern of the wiring 22D as Embodiment 1, it is possible to avoid such problems. Further, it is preferable that the wiring 22D has low resistance in consideration of input impedance and it is possible to realize low resistance by adopting an Al film as the main electrically conductive layer as adopted in Embodiment 1. Furthermore, by forming the wiring 22D having such a pattern as Embodiment 1 as the lowermost wiring layer and separating the wiring 22D as far as possible from the base pad 32 and the collector pads 33 formed as the uppermost wiring layer, it is possible to reduce MOS capacitance between: the base pad 32 and the collector pads 33; and the wiring 22D. By so doing, the impedance can be reduced further.

Figure 29:
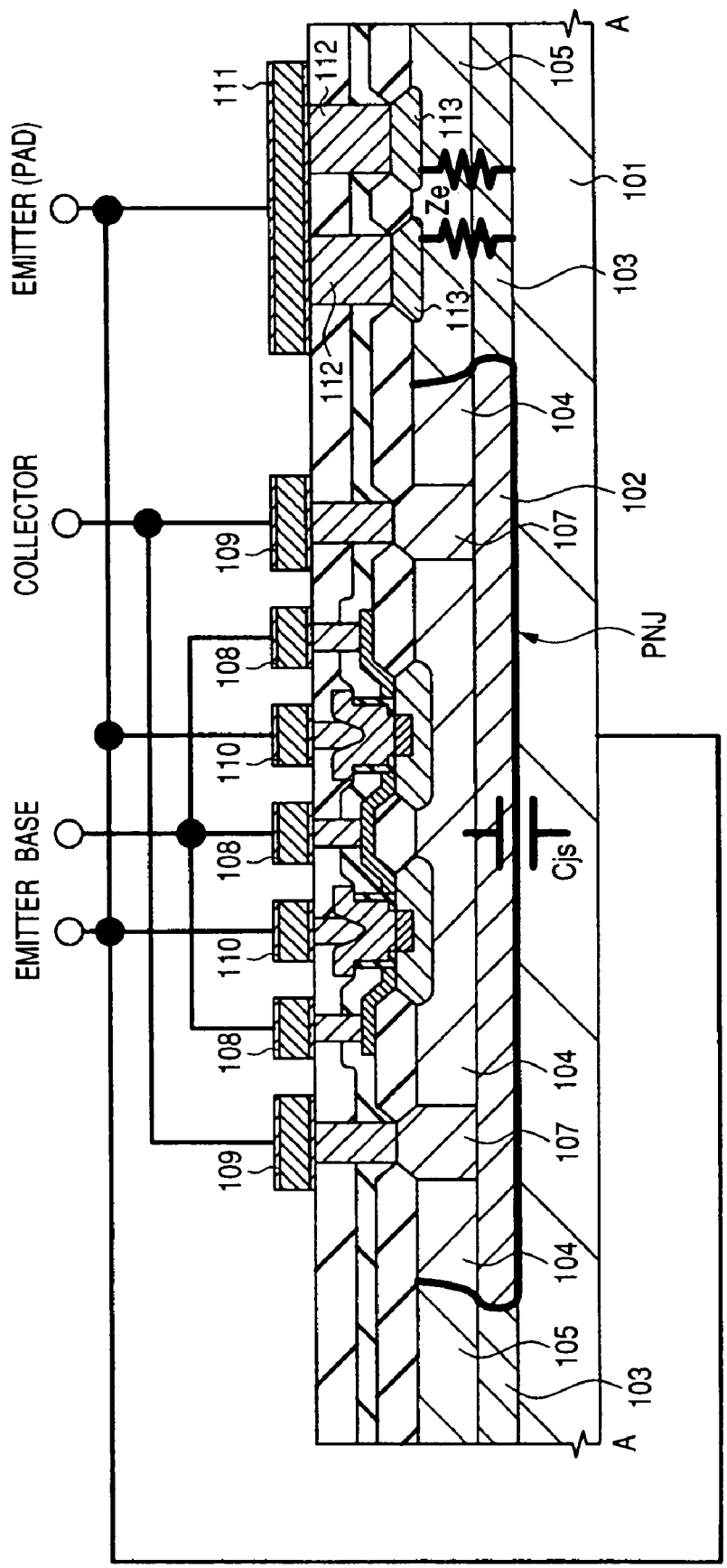
FIG. 29 is a sectional view showing the substantial part of the RF bipolar transistor studied by the present inventors.
Figure 30:
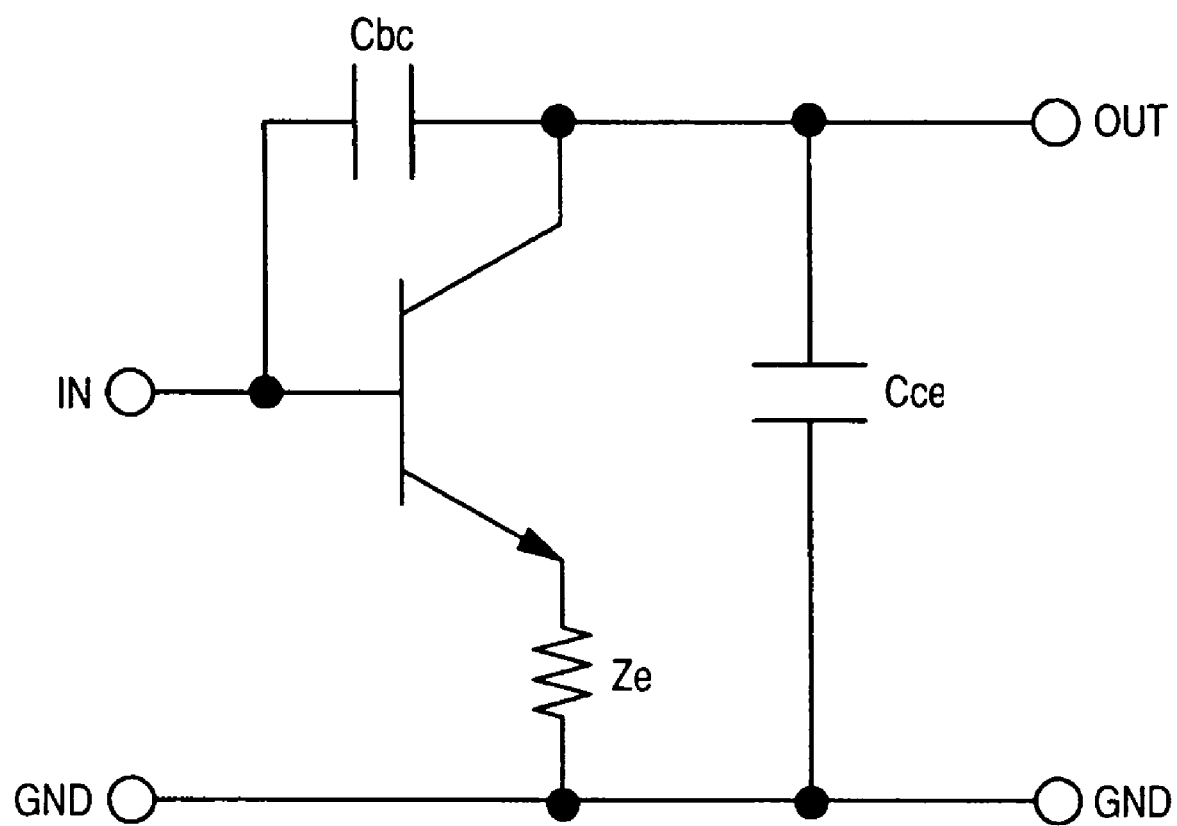
FIG. 30 is a circuit diagram of an RF bipolar transistor studied by the present inventors.

In the meantime, when device isolation is given without the use of an isolation section 8A, as shown in FIG. 29, a PN junction PNJ is formed between the p+ type substrate 101 and the n+ type collector embedded region 102, between the p+ type isolation region 103 and the n+ type collector embedded region 102, and between the p+ type isolation region 105 and the n type collector region 104 (the n+ type collector extraction region 107). In contrast, in an RF bipolar transistor according to Embodiment 1, the device isolation between the p+ type isolation region 3 and the n+ type collector embedded region 2 and between the p+ type isolation region 5 and the n type collector region 4 (the n+ type collector extraction region 7) is maintained with the isolation section 8A which has been explained with FIGS. 10 and 11. By so doing, the PN junction. PNJ (refer to FIG. 22) is reduced only to the region between the substrate 1 and the collector embedded region 2 (the bottom surface of the collector embedded region 2). That is, it is possible to reduce the junction capacitance Cjs (refer to FIG. 22), between the substrate and the collector, formed at the PN junction PNJ to a level lower than that of the case of the structure shown in FIG. 29. Further, since a wiring capacitance Cce between a collector and an emitter can be expressed with the expression Cce=Cjs+Ccx when a wiring capacitance Ccx between the collector and the emitter is represented by Ccx, the wiring capacitance Cce between the collector and the emitter can be reduced. In an RF bipolar transistor circuit, the wiring capacitance Cce between a collector and an emitter is the capacitance formed between an output (OUT) and a reference potential (GND) (refer to FIG. 30). A part of alternating current Iout flowing in a circuit by the influence of the wiring capacitance Cce undesirably flows toward the reference potential (GND) at a certain rate via the wiring capacitance Cce. It is estimated that, because of alternating current, such a current value increases as a wiring capacitance Cce increases. That is, when a certain alternating current Iout is applied, useless current undesirably flows out (leaks) and hence the efficiency of an RF bipolar transistor deteriorates. The phenomenon conspicuously appears when a used frequency is high. As stated above, according to Embodiment 1, since the wiring capacitance Cce can be reduced, it is possible to realize high efficiency in an RF bipolar transistor according to Embodiment 1.

In the meantime, there is a means wherein device isolation between a substrate and a collector is realized by adopting a PN junction isolation type wherein a PN junction is formed between the p+ type substrate 1 and the n+ type collector embedded region 2, between the p+ type isolation region 3 and the n+ type collector embedded region 2, and between the p+ type isolation region 5 and the n type collector region 4 (the n+ type collector extraction region 7). In the case of the device isolation of such a PN junction isolation type, junction capacitance Cjs between a substrate and a collector is formed at the PN junction PNJ (refer to FIG. 29). Here, when the dielectric constant of vacuum is represented by $\in O$, the relative dielectric constant of silicon by K, the width of a depletion layer by W, and the area of a PN junction PNJ by Acx, the junction capacitance Cjs between the substrate and the collector can be expressed with the expression Cjs=($\in O \cdot K/W$)·Acx. In the case of the device isolation of such a PN junction isolation type, not only the bottom surface of the collector embedded region 2 but also the side surfaces of the collector embedded region 2 and the collector region 4 (the collector extraction region 7) are included in the area Acx of the PN junction PNJ and hence that causes the junction capacitance Cjs between the substrate and the collector to increase. Further, when the wiring capacitance between a collector and an emitter is represented by Ccx, the capacitance Cce between the collector and the emitter is expressed with the expression Cce=Cjs+Ccx. That is, the capacitance Cce between a collector and an emitter increases as the junction capacitance Cjs between a substrate and the collector increases, and thus it is concerned that the high efficiency of an RF bipolar transistor is hardly obtained.

In contrast, in the case where an electrically conductive layer 18 (refer to FIGS. 16 and 17) is not disposed, an anti-insulative structure is formed wherein the current route between an emitter wiring (a wiring 22D) and a substrate 1 runs through the p+ type semiconductor region 7P and the isolation regions 5 and 3 and hence it is configured so that the current route may be formed between the emitter wiring and the substrate 1 with a bonding wire BW (refer to FIGS. 24 and 25) outside a chip 1C. As a result, the impedance Ze between the emitter wiring and the substrate 1 (the resistance component and the inductance component in the current route between the emitter wiring and the substrate 1) increases. Here, when the cutoff frequency of an RF bipolar transistor is represented by fT, the operating frequency of the RF bipolar transistor by f, a base resistance by rb, and the capacitance between a base and a collector by Cbc, the power gain PG of the RF bipolar transistor is expressed with the expression PG≅10 log [fT/(8·π·f2·rb·Cbc·Ze)]. That is, when the impedance Ze increases, the power gain PG lowers. Then in the application to a wireless LAN in particular, the operating frequency f is in a high-frequency band as high as 5 GHz and hence it is concerned that the influence of the impedance Ze on the power gain PG increases.

On the other hand, in an RF bipolar transistor according to Embodiment 1 which has been explained with FIGS. 1 to 25, the current route between an emitter wiring (a wiring 22D) and a substrate 1 is formed by disposing the aforementioned electrically conductive layer 18 (refer to FIGS. 16 and 17). By so doing, the impedance Ze between the emitter wiring (the wiring 22D) and the substrate 1 can be reduced and hence it is possible to prevent the power gain PG of the RF bipolar transistor from lowering. That is, an RF bipolar transistor according to Embodiment 1 can realize a high gain.

Embodiment 2

Embodiment 2 is hereunder explained.

Figure 26:
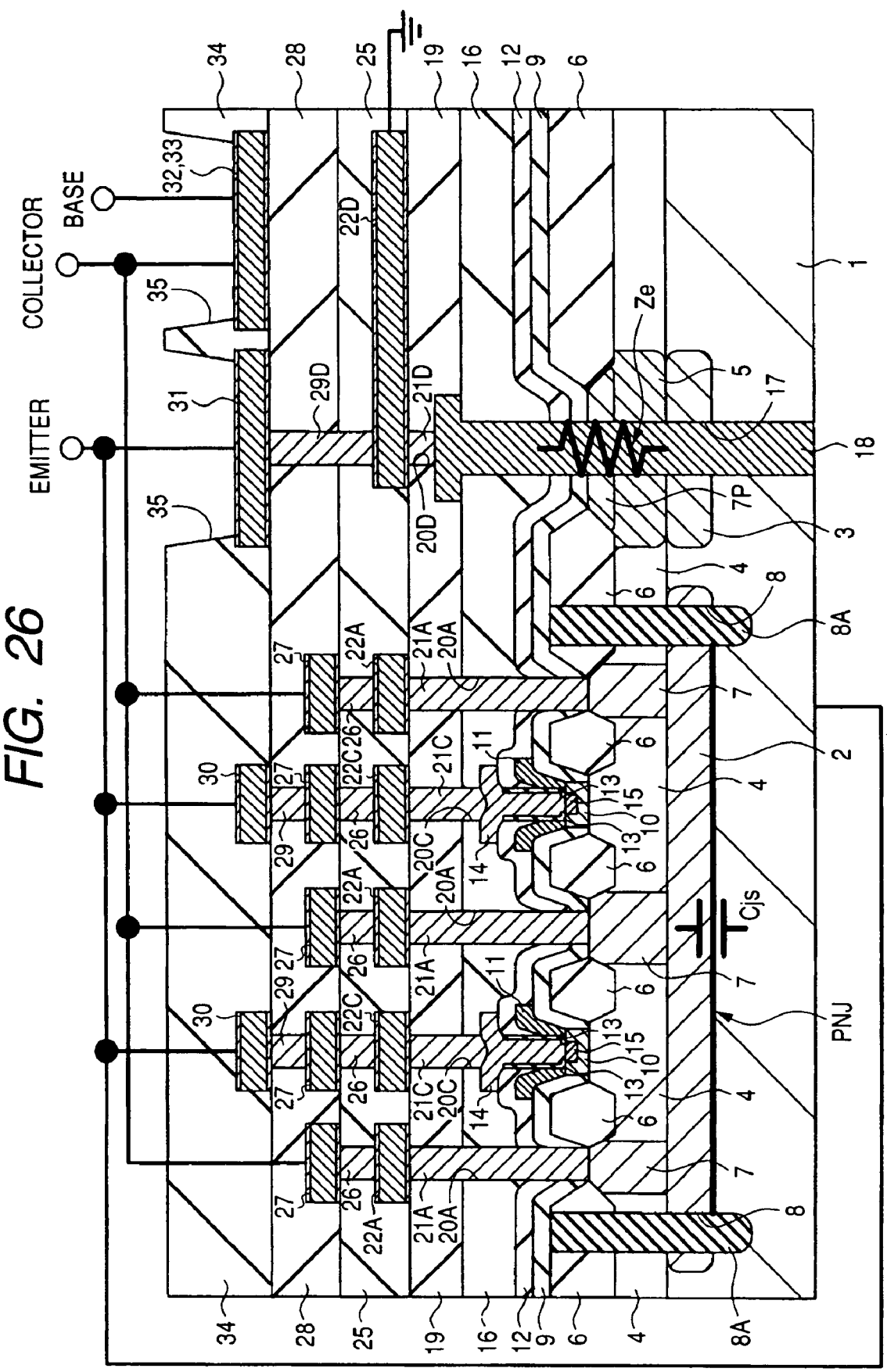
FIG. 26 is a sectional view showing a substantial part of a semiconductor device according to Embodiment 2 of the present invention.

As shown in FIG. 26, in Embodiment 2, the electrically conductive layer 18 explained in aforementioned Embodiment 1 is formed so as to reach the bottom surface of a substrate 1. In order to form such an electrically conductive layer 18 according to Embodiment 2, after emitter pads 31, a base pad 32, and collector pads 33 are formed, the back surface of a substrate 1 is finished in polishing treatment so that the final thickness of a chip 1C may be thinner than that in the case of Embodiment 1 (about 80 μm for example) and thereby the electrically conductive layer 18 is exposed on the back surface of the substrate 1. Otherwise, the depth of a groove 17 wherein the electrically conductive layer 18 is formed may be increased beforehand. By disposing an electrically conductive layer 18 according to Embodiment 2, the electrically conductive layer 18 directly touches the emitter wiring EL of a wiring board when the chip 1C is mounted on the wiring board (refer to FIGS. 24 and 25). By so doing, it is possible to reduce the impedance Ze between an emitter wiring (a wiring 22D) and the substrate 1 further than that in the case of Embodiment 1. As a result, it is possible to prevent the power gain PG of an RF bipolar transistor further than the case of Embodiment 1 from lowering. That is, an RF bipolar transistor according to Embodiment 2 can realize a higher gain than that according to Embodiment 1.

In Embodiment 2 too, the effects similar to those in Embodiment 1 can be obtained.

Embodiment 3

Embodiment 3 is hereunder explained.

In aforementioned Embodiment 1, the base of an RF bipolar transistor comprises a heterojunction layer 10 (refer to FIG. 13) formed by laminating an undoped SiGe layer, a p type SiGe layer, and an undoped silicon layer. In contrast, in Embodiment 3, a base is formed by introducing a p+ type impurity into an active region L1 (refer to FIGS. 6 and 7) for an emitter-base junction region.

Figure 27:
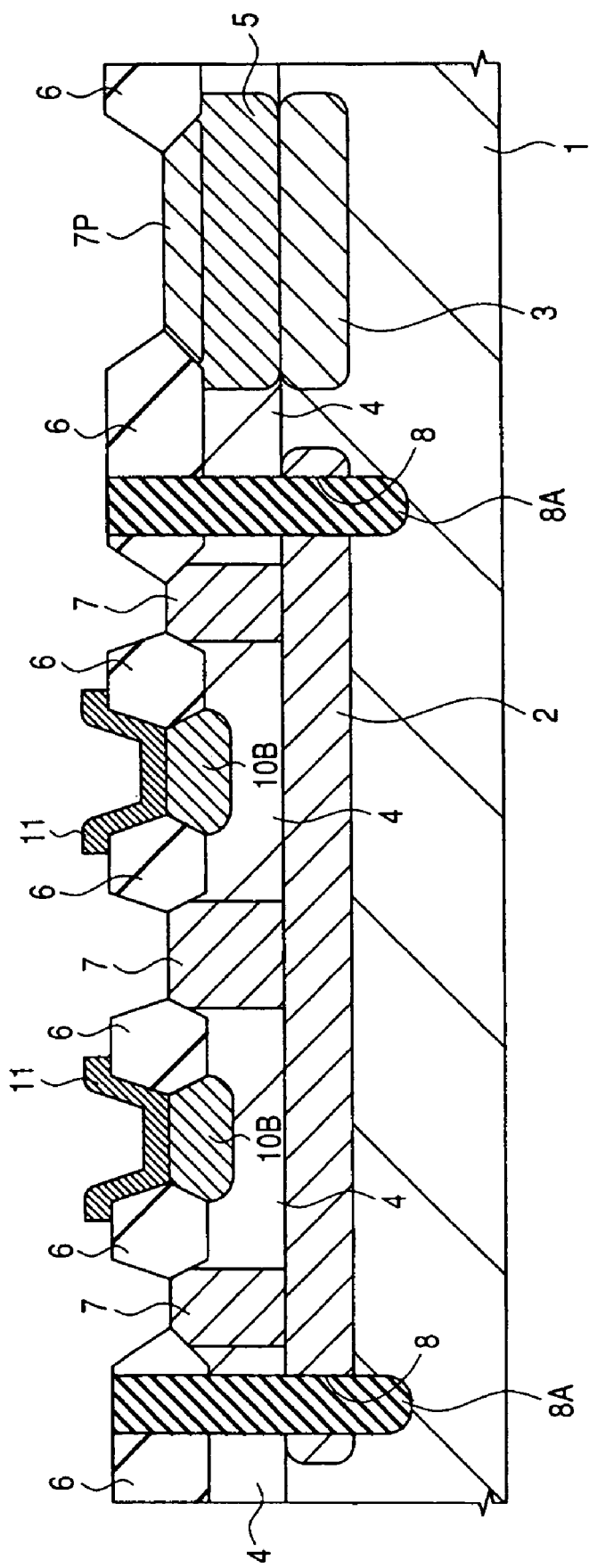
FIG. 27 is a sectional view showing a substantial part of a semiconductor device according to Embodiment 3 of the present invention in a manufacturing process.
Figure 28:
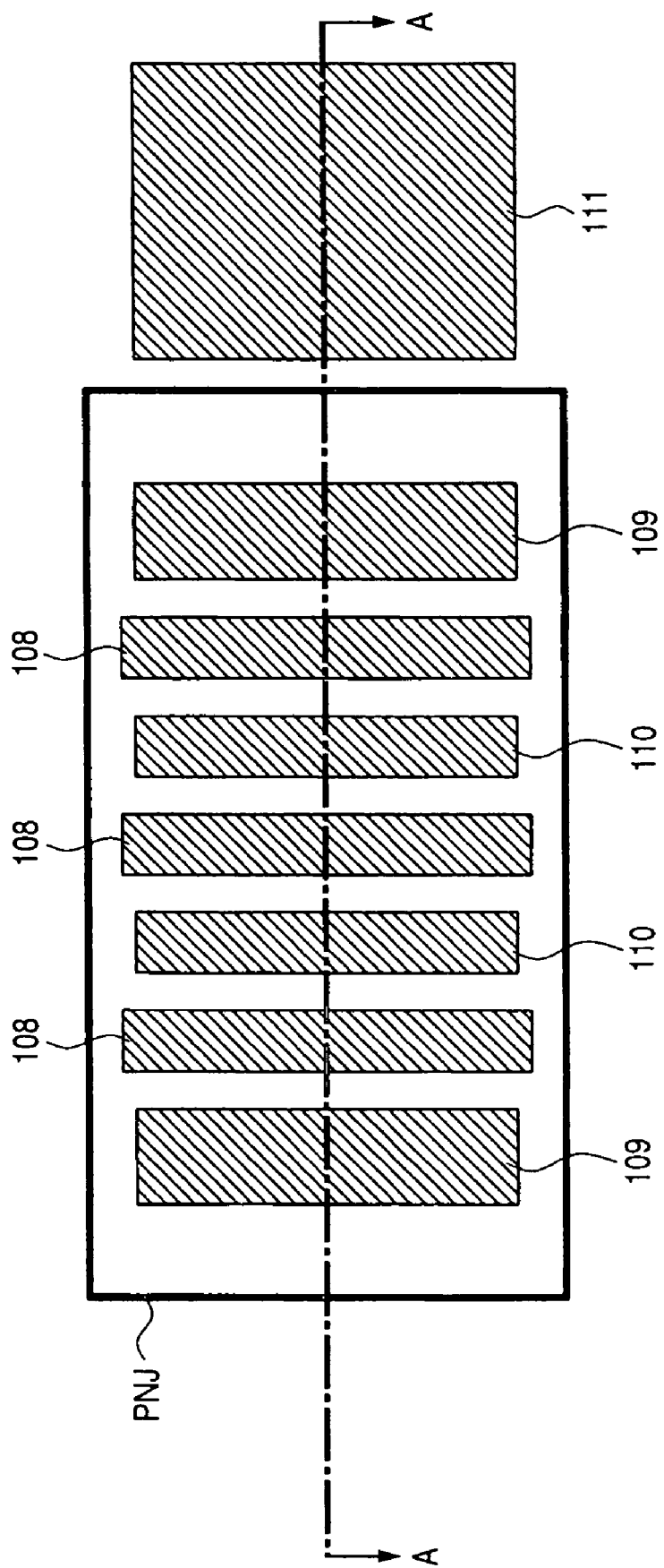
FIG. 28 is a plan view showing a substantial part of an RF bipolar transistor studied by the present inventors.

The manufacturing processes of an electronic device or a semiconductor device according to Embodiment 3 are the same as those of Embodiment 1 until the processes explained in Embodiment 1 in reference to FIGS. 1 to 11. Thereafter, as shown in FIG. 27, a p type base region (a third semiconductor layer) 10B is formed in the active region for an emitter-base junction region by the ion implantation method or the like through a lithography process and thus a pn junction is formed. Subsequently, a polysilicon film into which a p type impurity (for example B) is introduced is deposited over a substrate 1, thereafter the polysilicon film is patterned through another lithography process, and a base extraction electrode 11 is formed.

After that, an electronic device or a semiconductor device according to Embodiment 3 is manufactured through processes similar to the processes explained in Embodiment 1 in reference to FIGS. 14 to 25.

In Embodiment 3 too, the effects similar to those in Embodiment 1 can be obtained.

Embodiment 4

Embodiment 4 is hereunder explained.

Figure 31:
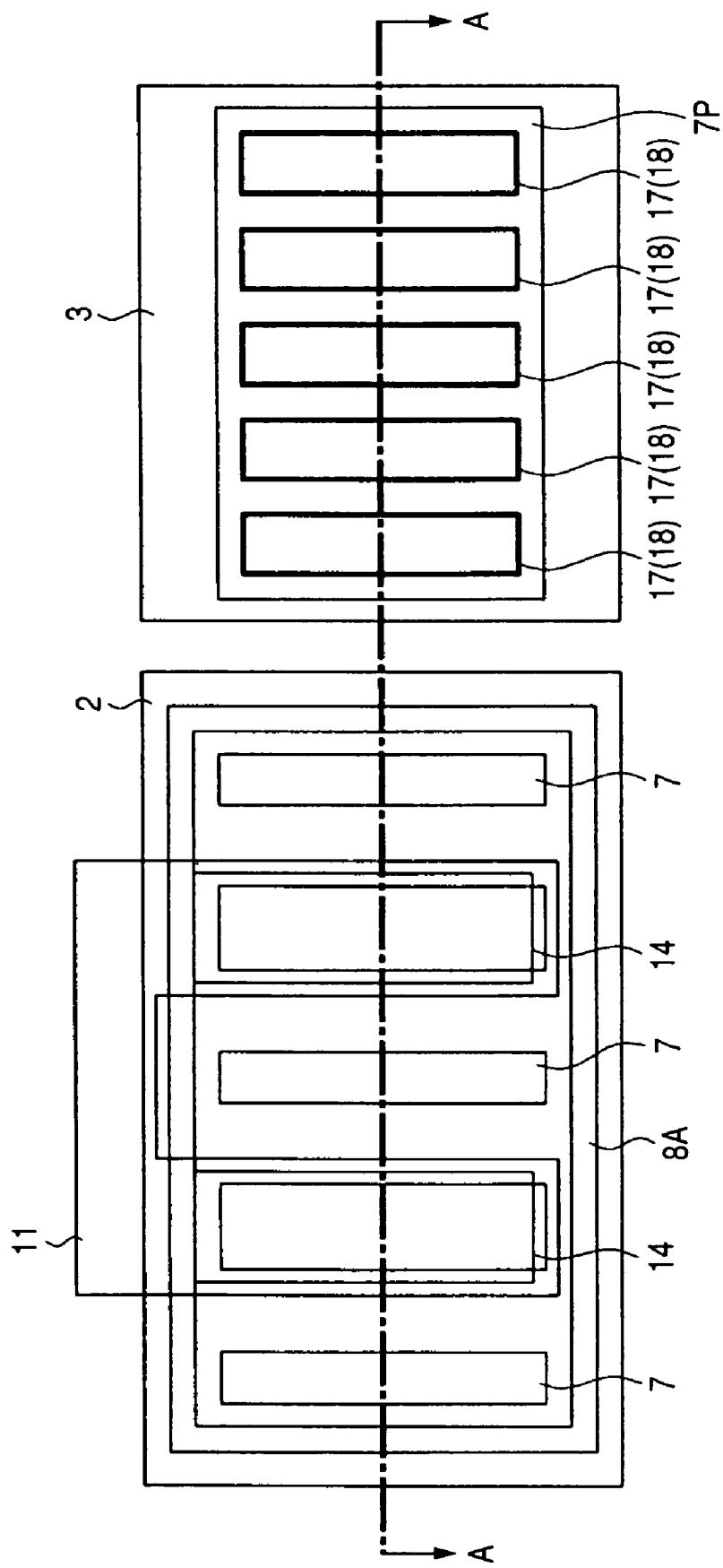
FIG. 31 is a plan view showing a substantial part of a semiconductor device according to Embodiment 4 of the present invention in a manufacturing process.
Figure 32:
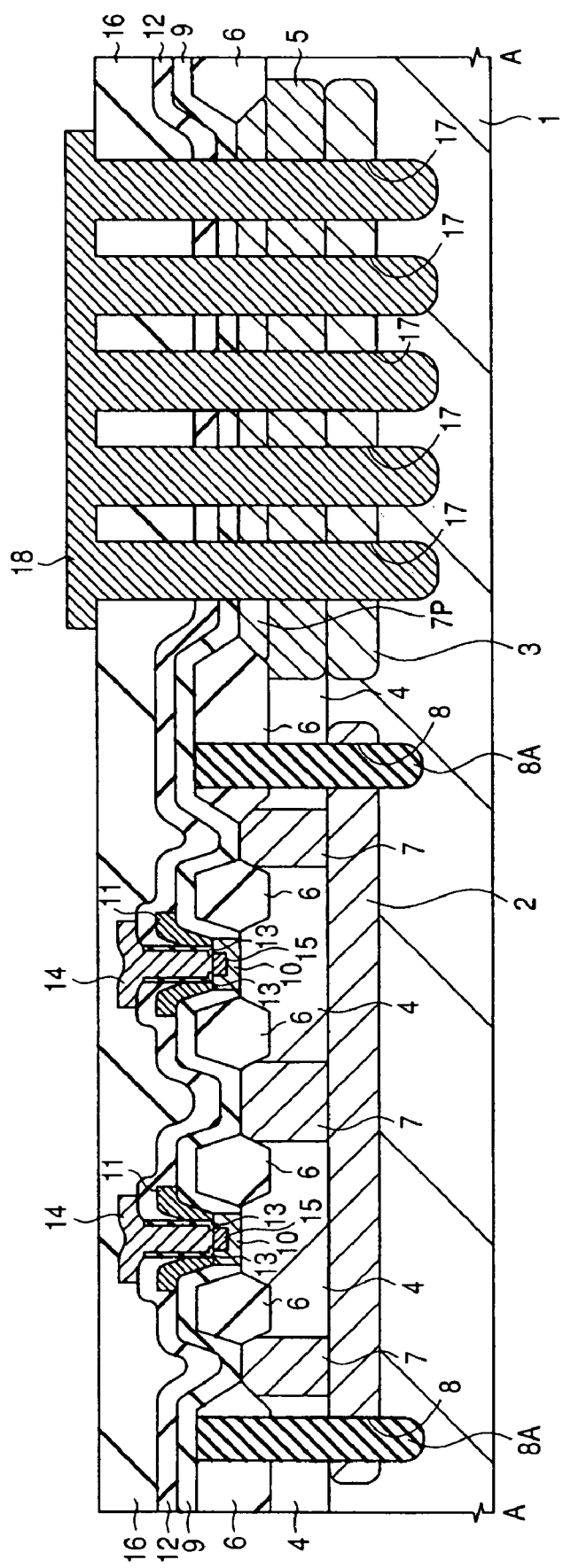
FIG. 32 is a sectional view showing the substantial part of the semiconductor device according to Embodiment 4 of the present invention in the manufacturing process.

FIGS. 31 and 32 are a plan view and a sectional view, respectively, showing a substantial part of a semiconductor device according to Embodiment 4 in a manufacturing process.

As shown in FIGS. 31 and 32, in Embodiment 4, plural planar-shaped grooves 17 one of which is shown also in Embodiments 1 and 2 are formed. Here, "planar-shape" means a shape on a plane parallel with the main surface of a substrate 1 as shown also in FIG. 17 in Embodiment 1 (in FIG. 17, shown as the electrically conductive layer 18 embedded in the groove 17). Then, the manufacturing processes of a semiconductor device according to Embodiment 4 are the same as those in Embodiments 1 and 2 and FIGS. 31 and 32 represent the situation at the same process as used in the explanation of Embodiment 1 referring to FIGS. 16 and 17.

As it has been explained also in Embodiment 1, in the case where an electrically conductive layer 18 (a groove 17) is not disposed, an anti-insulative structure is formed wherein the current route between an emitter wiring (a wiring 22D, refer to FIG. 22) and a substrate 1 runs through the p+ type semiconductor region 7P and the isolation regions 5 and 3 and hence it is configured so that a current route may be formed between the emitter wiring and the substrate 1 with a bonding wire BW (refer to FIGS. 24 and 25) outside a chip 1C. As a result, the impedance Ze between the emitter wiring and the substrate 1 (the resistance component and the inductance component in the current route between the emitter wiring and the substrate 1) increases. When the impedance Ze increases, the power gain lowers. Then in the application to a wireless LAN in particular, the operating frequency is in a frequency band as high as 5 GHz and hence it is concerned that the influence of the impedance Ze on the power gain increases.

In an RF bipolar transistor according to Embodiment 4, in the same way as an RF bipolar transistor according to Embodiment 1, the current route between an emitter wiring (a wiring 22D) and a substrate 1 is formed by disposing an electrically conductive layer 18. Further, by disposing plural grooves 17, it is possible to make the sectional area of the current route between the emitter wiring and the substrate 1 larger than that of an RF bipolar transistor according to Embodiment 1. By so doing, in an RF bipolar transistor according to Embodiment 4, it is possible to reduce the impedance Ze between an emitter wiring (a wiring 22D) and a substrate 1 to a level lower than that of an RF bipolar transistor according to Embodiment 1 and hence it is possible to prevent the power gain PG of an RF bipolar transistor yet more effectively than Embodiment 1 from lowering. That is, an RF bipolar transistor according to Embodiment 4 can realize a higher gain than that according to Embodiment 1.

Embodiment 5

Embodiment 5 is hereunder explained.

Figure 33:
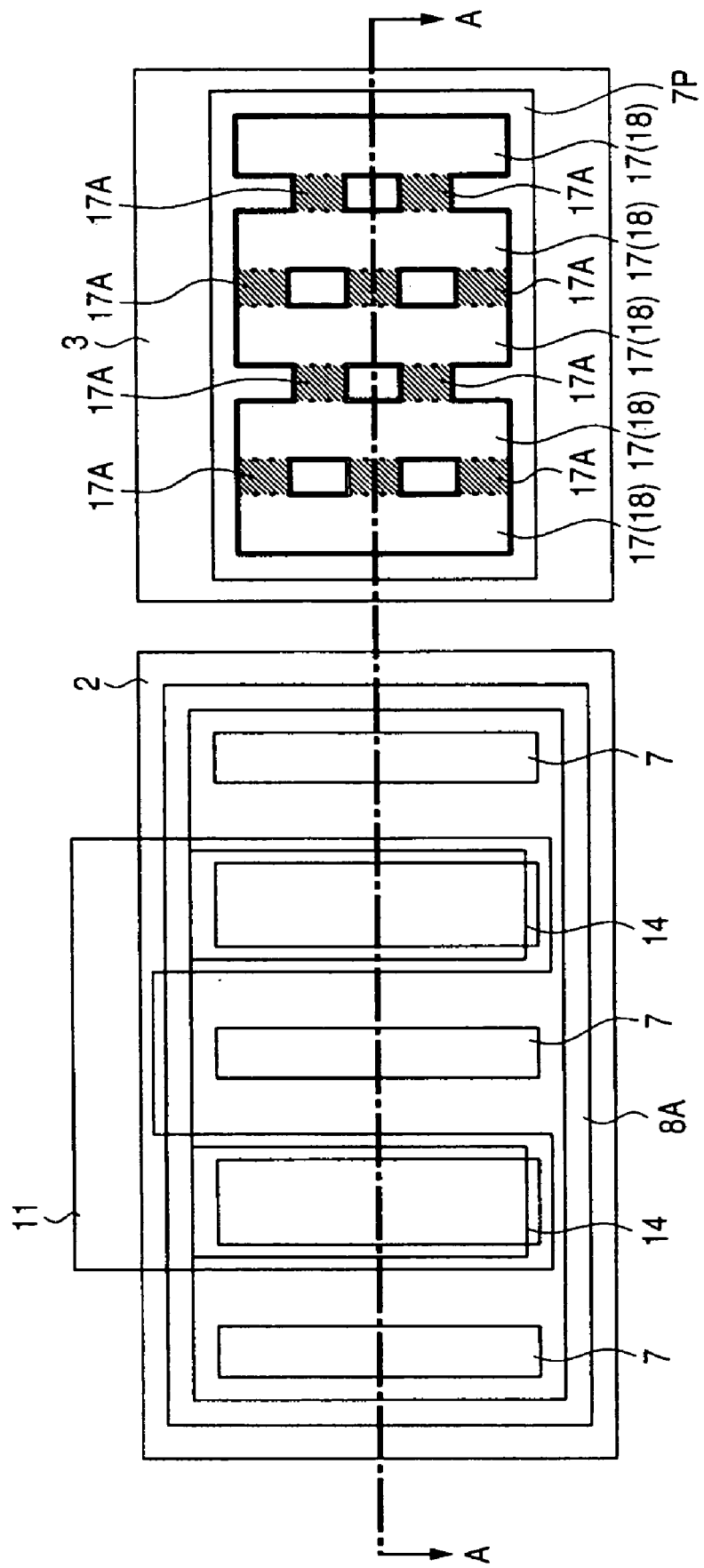
FIG. 33 is a plan view showing a substantial part of a semiconductor device according to Embodiment 5 of the present invention in a manufacturing process.
Figure 34:
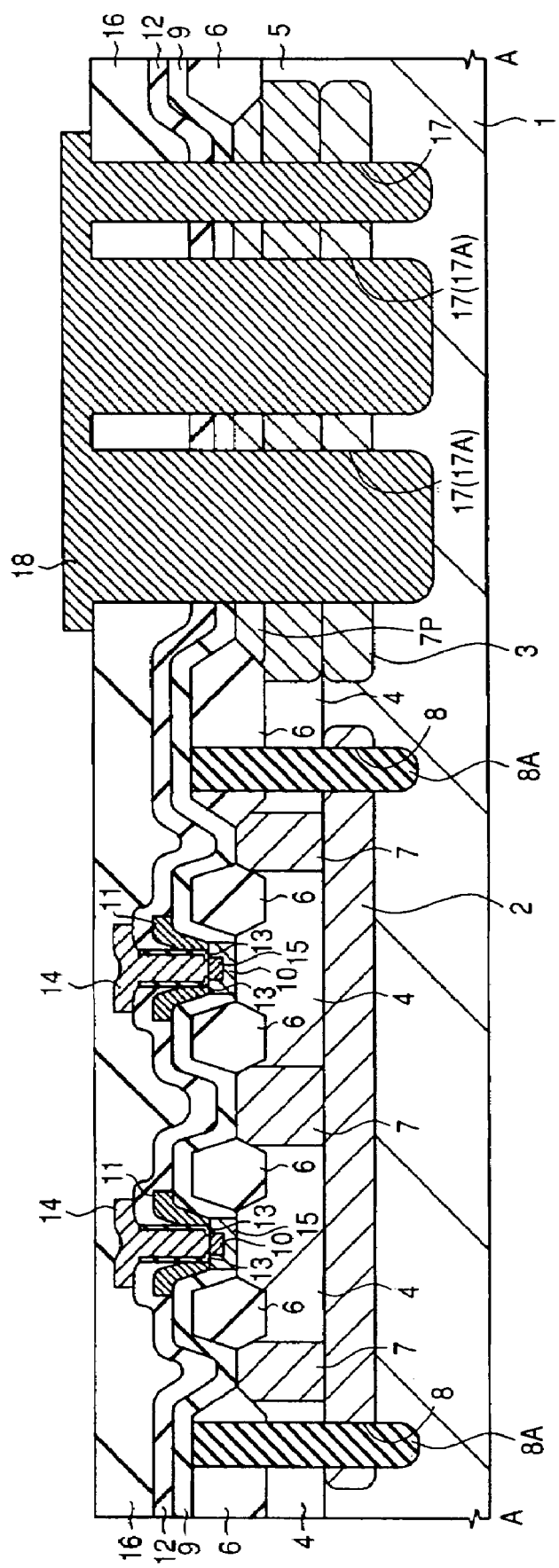
FIG. 34 is a sectional view showing the substantial part of the semiconductor device according to Embodiment 5 of the present invention in the manufacturing process.

FIGS. 33 and 34 are a plan view and a sectional view, respectively, showing a substantial part of a semiconductor device according to Embodiment 5 in a manufacturing process.

As shown in FIGS. 33 and 34, in Embodiment 5 too, plural grooves 17 are formed in the same way as Embodiment 4. Further in Embodiment 5, the plural grooves 17 are connected to each other with plural grooves (third grooves) 17A. The plural grooves 17A can be formed together with the plural grooves 17 in the same process and the depth of the grooves 17A is identical to the depth of the grooves 17. Here in FIG. 33, in order to make the positions of the grooves 17A clearly understandable, the grooves 17A are shown with hatching. By disposing such grooves 17A, in an RF bipolar transistor according to Embodiment 5, it is possible to make the sectional area of the current route between an emitter wiring (a wiring 22D, refer to FIG. 22) and a substrate 1 larger than that of an RF bipolar transistor according to Embodiment 4. By so doing, in an RF bipolar transistor according to Embodiment 5, it is possible to reduce the impedance Ze between the emitter wiring and the substrate 1 to a level lower than that of an RF bipolar transistor according to Embodiment 4 and hence it is possible to prevent the power gain PG of an RF bipolar transistor yet more effectively than Embodiment 4 from lowering. That is, an RF bipolar transistor according to Embodiment 5 can realize a higher gain than that according to Embodiment 1.

Figure 35:
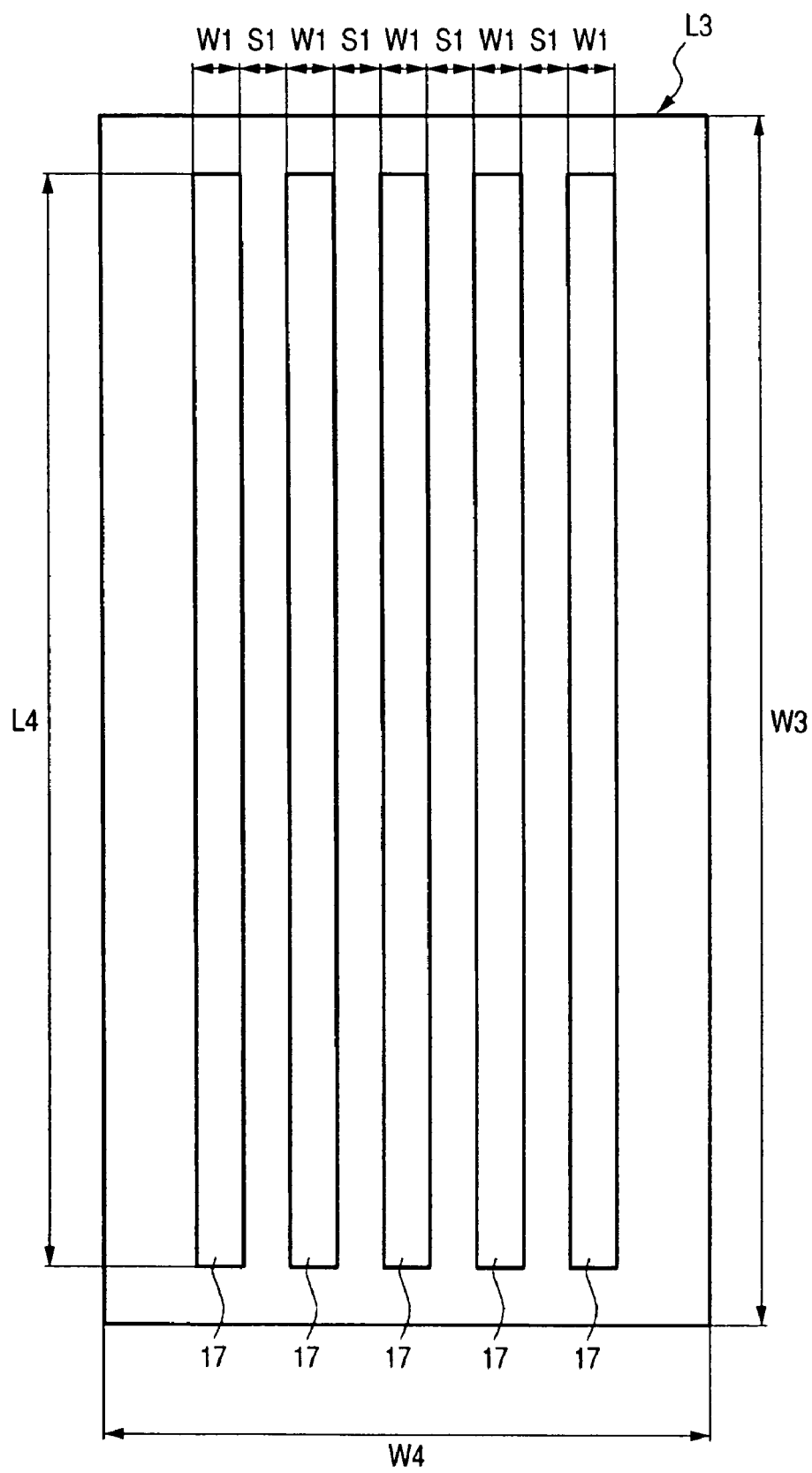
FIG. 35 is a plan view showing a substantial part of the semiconductor device according to Embodiment 4 of the present invention in a manufacturing process in comparison with the semiconductor device according to Embodiment 5 of the present invention.
Figure 36:
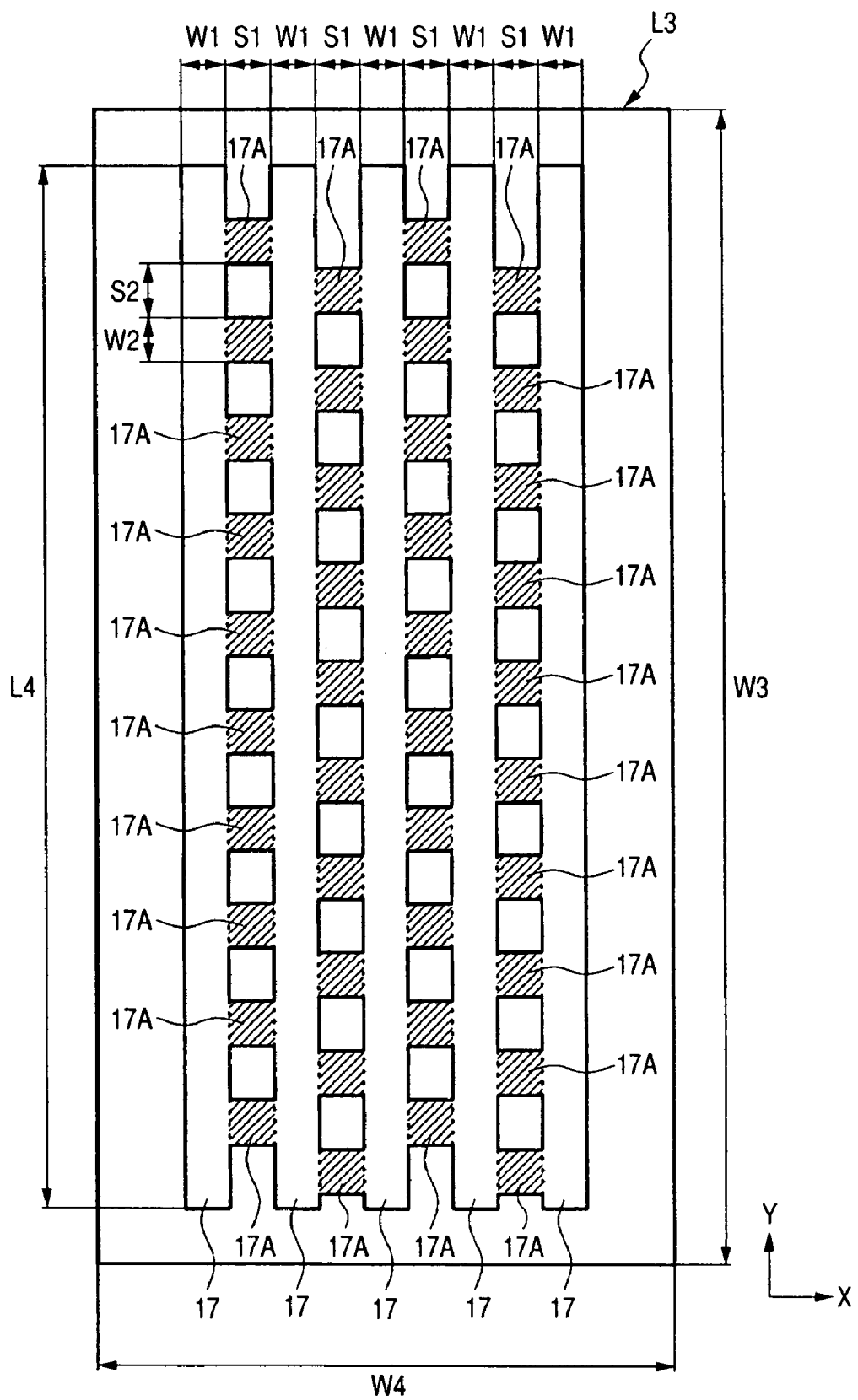
FIG. 36 is a plan view showing a substantial part of the semiconductor device according to Embodiment 5 of the present invention in a manufacturing process.

Here, detailed allocation of the grooves 17A according to Embodiment 5 is explained. FIG. 35 is an expanded plan view showing a substantial part of plural grooves 17 according to Embodiment 4 and FIG. 36 is an expanded plan view showing a substantial part of plural grooves 17 and 17A according to Embodiment 5. FIG. 36 is further expanded plan view showing part of the plural grooves 17 and 17A shown in FIG. 35.

FIGS. 35 and 36 represent the case where the number of the grooves 17 is five. The width W1 and the length L4 of each of the grooves 17 and the space S1 between adjacent grooves 17 in Embodiment 5 are identical to those in Embodiment 4. Then the length of the grooves 17A is specified by the space S1 of adjacent grooves 17, and the width W2 of the grooves 17A and the space S2 between adjacent grooves 17A are specified in the direction (hereunder referred to as "Y direction") perpendicular to the extending direction (the longitudinal direction, hereunder referred to as "X direction").

In the main surface of a substrate 1, the region (including the region between adjacent grooves 17) in the main surface of the substrate 1 where the grooves 17 and 17A are formed is regulated by an active region L3 (refer to also FIGS. 6 and 7) surrounded by an isolation section 6, and the area of the active region can be specified by the expression W3×W4 when the length of the active region L3 in the extending direction of the grooves 17 (Y direction) is represented by W3 and the length thereof in the width direction of the grooves 17 (X direction) is represented by W4. In the active region L3 specified by the expression W3×W4, Embodiment 4 is the case where only five grooves 17 are formed and Embodiment 5 is the case where plural grooves 17A with which the grooves 17 are connected to each other are formed in addition to the five grooves 17 of Embodiment 4. That is, in Embodiment 5, it is possible to make the sectional area of the current route between an emitter wiring (a wiring 22D, refer to FIG. 22) and a substrate 1 larger than that of an RF bipolar transistor according to Embodiment 4 without increasing the size of a chip 1C (refer to FIGS. 24 and 25).

Further, in the aforementioned active region L3, in order to make the sectional area of the current route between an emitter wiring and a substrate 1 as large as possible, it is preferable to make the space S1 between adjacent grooves 17 and the space S2 between adjacent grooves 17A as small as possible and the width W1 of the grooves 17 and the width W2 of the grooves 17A as large as possible, and in Embodiment 5, following regulations on designs of grooves 17 and 17A are exemplified.

Figure 37:
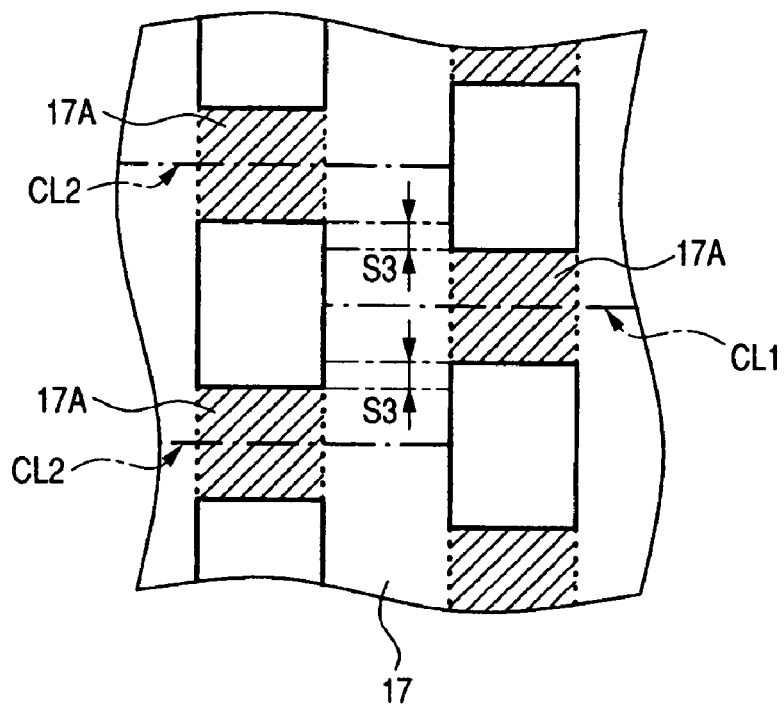
FIG. 37 is an expanded plan view of a substantial part of the semiconductor device shown in FIG. 36.
Figure 38:
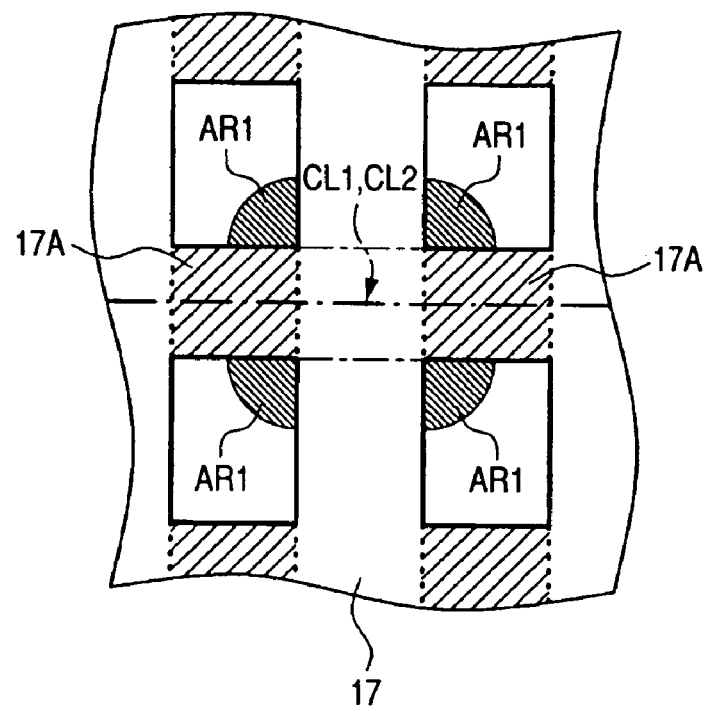
FIG. 38 is a plan view showing a substantial part of a semiconductor device in comparison with the semiconductor device according to Embodiment 5 of the present invention.

Firstly, with regard to one groove 17, a groove (a third groove) 17A connected to a long side (a first long side) and a groove (a fourth groove) 17A connected to the other long side (a second long side) are arranged so as not to overlap with each other in the width direction (Y direction) and so as to be spaced at a space S3 in the width direction (Y direction). That is, the center lines CL1 and CL2 of those two grooves 17A in the width direction (Y direction) are arranged so as not to be located on an identical straight line. Here, FIG. 37 is an expanded plan view showing the substantial part of the semiconductor device shown in FIG. 36. The present inventors have found that, in contrast when a groove 17A connected to a long side and a groove 17A connected to the other long side overlap with each other in the width direction (Y direction) (refer to FIG. 38), stress is imposed on the region AR1 where a grove 17 and a groove 17A intersect each other due to heat or the like during the manufacturing processes of an RF bipolar transistor and damages including cracks and the like are caused in the region AR1 on a substrate 1. If such damages are caused on a substrate 1, electric current leaks from the region AR1 where the damages are caused when an RF bipolar transistor is actuated, the properties of the RF bipolar transistor are deteriorated, and drawbacks including the lowering of the power gain PG of the RF bipolar transistor are caused. In Embodiment 5, the grooves 17A are formed under such arrangement regulations as shown in FIG. 37 in order to avoid such drawbacks.

Further, as stated above, it is preferable to make the width W1 of the grooves 17 and the width W2 of the grooves 17A as large as possible. The present inventors have found however that, when the widths are too large, an electrically conductive film 18 is insufficiently embedded in the grooves 17 and 17A and voids are caused in the interiors of the grooves 17 and 17A. In Embodiment 5 accordingly, it is exemplified that the width W1 of the grooves 17 and the width W2 of the grooves 17A are about 1 µm or less. Furthermore, it has been mentioned earlier that preferably the space S1 between adjacent grooves 17 and the space S2 between adjacent grooves 17A are as small as possible. In a lithography process for forming a planar pattern of the grooves 17 and 17A however, excessively small spaces S1 and S2 are hardly resolved. In addition, it is exemplified that the relationship between the width W1 of grooves 17 and the space S1 between adjacent grooves 17 is expressed with the expression $0.5 \leq W1/S1 \leq 3$.

In order to satisfy the aforementioned design regulations of the grooves 17 and 17A, it can be exemplified in Embodiment 5 that the width W1 of the grooves 17 is set at about 1 µm, the width W2 of the grooves 17A at about 1 µm, the space S1 between adjacent grooves 17 at about 1 µm, and the space S2 between adjacent grooves 17A at about 1.2 µm. The total area, in a plan view, of the grooves 17 and 17A formed under such conditions, when the length L4 of the grooves 17 is about 24 µm, is: about 120 µm$^2$ in the case where only the grooves 17 are formed as shown in FIG. 35; and about 168 µm$^2$ in the case where the grooves 17 and 17A are formed as shown in FIG. 36. That is, in Embodiment 5, it is possible to increase the total area, in a plan view, of the grooves 17 and 17A to 1.4 times that in Embodiment 4 in the active region L3 the area of which is represented by the expression W3×W4.

Meanwhile, though, in Embodiment 1, the case of forming an electrically conductive film 18 by laminating a TiN film and a W film and the case of forming an electrically conductive film 18 by embedding a polysilicon film wherein a p type impurity (for example boron) is doped in a groove 17 are exemplified, it is also possible to form an electrically conductive film 18 by depositing an Au film while embedding the Au film in grooves 17 and 17A by the sputtering method. It can be exemplified that the design regulations of the grooves 17 and 17A in the case where an electrically conductive film 18 is made of an Au film are also the same as the design regulations described in Embodiment 5.

Further, grooves 17 and 17A and an electrically conductive film 18 embedded in the grooves 17 and 17A may be configured either so as to be exposed on the back surface of a substrate 1 (refer to Embodiment 2 (FIG. 26)) or so as not to be exposed on the back surface of a substrate 1 (refer to Embodiment 1 (FIG. 22)) after the polishing treatment of the back surface of the substrate 1.

The present invention established by the present inventors has been concretely explained above on the basis of the embodiments. However, it goes without saying that the present invention is not limited to the embodiments and can be variously modified in the range not deviating from the tenor thereof.

A semiconductor device, an electronic device, and a manufacturing method of the semiconductor device according to the present invention can be widely applied to: a PA of a digital radio communication device such as a wireless LAN for example; the manufacturing steps thereof; and others.

What is claimed is:

1. A semiconductor device including a bipolar transistor, the bipolar transistor comprising:
   a semiconductor substrate of a first conduction type;
   an embedded collector region of a second conduction type opposite the first conduction type formed over the semiconductor substrate;
   a collector region of the second conduction type formed over the embedded collector region;
   a base region of the first conduction type formed over the collector region;
   an emitter region of the second conduction type formed over the base region;
   a base extraction electrode formed over the base region and electrically connected to the base region;
   an emitter extraction electrode formed over the emitter region and electrically connected to the emitter region;
   a collector extraction region of the second conduction type formed over the embedded collector region and disposed so as to surround the collector region, the base region, and the emitter region in plan view, the collector extraction region being electrically connected to the embedded collector region and the collector region;
   a first inter layer insulating film formed over the base extraction electrode and the collector extraction region;
   a collector wiring, a base wiring, and an emitter wiring formed over the inter layer insulating film and electrically connected to the collector extraction region, the base extraction electrode, and the emitter extraction electrodes, respectively; and
   the semiconductor device further including:
   a first groove formed outside of the collector extraction region in plan view, the first groove extending through the first inter layer insulating film and the first groove reaching the semiconductor substrate;
   a first electrically conductive film embedded in the first groove and electrically connected to the semiconductor substrate;
   a second inter layer insulating film formed over the collector wiring, the base wiring, and the emitter wiring;
   a collector pad, a base pad, and an emitter pad formed over the second interlayer insulating film and electrically connected to the collector wiring, the base wiring, and the emitter wiring, respectively, the emitter pad being electrically connected to the first electrically conductive film; and
   a protection film formed over the collector pad, the base pad, and the emitter pad, the collector pad, the base pad, and the emitter pad being partially exposed from the protection film.

2. The semiconductor device according to claim 1, further including:
   a second groove formed over the semiconductor substrate and surrounding the collector extraction region in plan view, the second groove penetrating the collector region and the embedded collector region and reaching the semiconductor substrate; and
   an insulating film embedded in the second groove,
   wherein the first groove is disposed outside the second groove.

3. The semiconductor device according to claim 1, wherein the first electrically conductive film is comprised of tungsten as a main component.

4. The semiconductor device according to claim 1, wherein the first groove extends into the semiconductor substrate.

5. The semiconductor device according to claim 1, wherein the base region is comprised of silicon germanium.

6. The semiconductor device according to claim 1, wherein the collector extraction region is an ion implantation region.

7. The semiconductor device according to claim 1, wherein the first conduction type and the second conduction type are p-type and n-type, respectively.

8. The semiconductor device according to claim 1, wherein an impurity concentration of the embedded collector region is higher than that of the collector region.

9. The semiconductor device according to claim 1, wherein the first electrically conductive film is comprised of polysilicon having the first conduction type.

10. The semiconductor device according to claim 1, wherein respective bonding wires are connected to the collector pad, the base pad, and the emitter pad from outside the semiconductor substrate.

* * * * *